US006972508B2

(12) United States Patent
Kandou et al.

(10) Patent No.: US 6,972,508 B2
(45) Date of Patent: Dec. 6, 2005

(54) SURFACE ACOUSTIC WAVE DEVICE

(75) Inventors: Hajime Kandou, Nagaokakyo (JP);
Michio Kadota, Kyoto (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/840,359

(22) Filed: Apr. 23, 2001

(65) Prior Publication Data

US 2001/0045791 A1 Nov. 29, 2001

(30) Foreign Application Priority Data

Apr. 28, 2000 (JP) ........................................ 2000-130168

(51) Int. Cl.[7] .............................................. H03H 9/25
(52) U.S. Cl. .................................................. 310/313 A
(58) Field of Search ........................ 310/313 A, 313 R, 310/313 D; 333/195; H03H 9/25

(56) References Cited

U.S. PATENT DOCUMENTS

| 4,952,832 | A | * | 8/1990 | Imai et al. ............... | 310/313 A |
| 5,329,208 | A | * | 7/1994 | Imai et al. ............... | 310/313 R |
| 5,401,544 | A | * | 3/1995 | Nakahata et al. ........ | 310/313 A |
| 5,432,392 | A | * | 7/1995 | Kadota et al. ........... | 310/313 A |
| 5,646,468 | A | * | 7/1997 | Nakahata et al. ........ | 310/313 A |
| 5,888,646 | A | * | 3/1999 | Takahashi et al. ........ | 428/336 |
| 6,121,713 | A | * | 9/2000 | Inoue et al. ............. | 310/313 A |
| 6,310,424 | B1 | * | 10/2001 | Ogura et al. ............. | 310/313 R |
| 6,310,425 | B1 | * | 10/2001 | Tanaka ..................... | 310/313 R |
| 2001/0035695 | A1 | * | 11/2001 | Kadota et al. ........... | 310/313 R |

FOREIGN PATENT DOCUMENTS

| JP | 54-066792 | 5/1979 |
| JP | 57-073513 | 5/1982 |
| JP | 61-222312 | 10/1986 |
| JP | 64-015421 | 1/1989 |
| JP | 09-130192 | 5/1997 |
| JP | 10-224172 | 8/1998 |

OTHER PUBLICATIONS

Kadota ("Combination of zno film and quartz to realized large coupling factor and Excellent Temperature Coefficient for the Saw device" IEEE 1997 UltraSonic Symposium).*

Michio Kadota, SAW properties of ZN0 Film on ST-35X Quartz having an Excellent Temperature Coefficient and a Suitable Electrochemical Coupling Factor, The Japan Society for the Promotion of Science, the Surface Acoustic Wave Device Technique 150th Committee, the 59th data for study (1988), pp. 645–650.

Seiichi Mitobe, Masanori Koshiba, and Michio Suzuki; Finite–Element Analysis of Periodically Perturbed Piezoelectric Waveguides; Transactions of Institute of Electronics and Communication Engineers of Japan, vol. J68–C No. 1 (1985), pp. 21–27.

Michio Kadota, Combination of ZnO Film and Quartz to Realize Large Coupling Factor and Excellent Temperature Coefficient for SAW Devices, 1997 IEEE Ultrasonics Symposium, pp. 261–266.

James J. Campbell and William R. Jones, A Method for Estimating Optimal Crystal Cuts and Propagation Directions for Excitation of Piezoelectric Surface Waves, IEEE Transactions on Sonics and Ultrasonics, vol. SU–15, No. 4, Oct. 1968.

* cited by examiner

Primary Examiner—Thomas M. Dougherty
Assistant Examiner—Karen Addison
(74) Attorney, Agent, or Firm—Keating & Bennett, LLP

(57) ABSTRACT

A surface acoustic wave device is constructed by forming a piezoelectric thin film on a quartz substrate, and in such a manner that the electromechanical coupling coefficient for a Rayleigh wave, $K^2$, is enlarged. In this surface acoustic wave device, a piezoelectric thin film is disposed on a quartz substrate, and comb electrodes are disposed on the interface between the quartz substrate and the piezoelectric thin film. The normalized film thickness H/λ of the piezoelectric thin film is preferably at least about 0.05.

12 Claims, 27 Drawing Sheets

SURFACE ACOUSTIC WAVE DEVICE

BACKGROUND OF THE INVENTION

1. Field of the Invention

The present invention relates to a surface acoustic wave device including a quartz substrate, and more particularly, to an improvement in surface acoustic wave devices formed by laminating a piezoelectric thin film on the quartz substrate.

2. Description of the Related Art

Conventionally, a surface acoustic wave device has been widely used for e.g., band-pass filters for use in mobile communication equipment. The surface acoustic wave (hereinafter referred to as "SAW") device has a structure wherein at least one interdigital transducer (hereinafter referred to as "IDT") is constructed on a piezoelectric substrate by forming at least one pair of comb electrodes so as to contact the piezoelectric substrate.

In recent years, various types of SAW devices, each using a piezoelectric thin film, have been proposed. Specifically, SAW devices have been proposed, each of which uses a surface acoustic wave substrate constructed by forming a piezoelectric thin film on an elastic substrate such as a glass substrate or a piezoelectric substrate.

As constructions using a surface acoustic wave substrate formed by laminating the piezoelectric thin film on the above-mentioned elastic substrate, the four kinds of structures are known which are shown in FIGS. 22A and 22B, and FIGS. 23A and 23B. In the SAW device 101 shown in FIG. 22A, a piezoelectric thin film 103 is provided on an elastic substrate 102, and IDTs 104 are disposed on this piezoelectric thin film 103. On the other hand, in the SAW device 105 shown in FIG. 22B, IDTs 104 are disposed on the bottom surface of the piezoelectric thin film 103, that is, on the interface between the elastic substrate 102 and the piezoelectric thin film 103. Also, in the SAW device 106 shown in FIG. 23A, a short-circuit electrode 107 is disposed on the elastic substrate 102, and the piezoelectric thin film 103 is laminated on this short-circuit electrode 107. The IDTs 104 are formed on the piezoelectric thin film 103. That is, the SAW device 106 is equivalent to the structure wherein the short-circuit electrode 107 is inserted into the interface between the elastic substrate 102 and the piezoelectric thin film 103, in the SAW device 101 shown in FIG. 22A.

In the SAW device 108 shown in FIG. 23B, a short-circuit electrode 107 is disposed on the piezoelectric thin film 103. The IDTs 104 are disposed on the interface between the elastic substrate 102 and the piezoelectric thin film 103. The SAW device 108 is, therefore, equivalent to the structure wherein the short-circuit electrode 107 is disposed on the top surface of the piezoelectric thin film 103, in the SAW device 105 shown in FIG. 22B.

FIG. 24 illustrates electromechanical coupling coefficients when the above-described SAW devices 101, 105, 106, and 108 are varied in the formation positions of the IDTs 104 and in the presence or absence of the short-circuit electrode 107, with other constructions under the same conditions, and when ZnO thin films are used as piezoelectric thin films, and glass substrates are used as elastic substrates.

In FIG. 24, there are shown the variations of the electromechanical coupling coefficients with respect to the normalized film thickness $H/\lambda$ of ZnO thin film in each of the above-described four kinds of SAW devices. In the present specification, H designates the thickness of a piezoelectric thin film, and $\lambda$ designates the wavelength of an excited surface acoustic wave (both are of the same unit).

In the figure, the solid line A indicates the result for the SAW device 101, the broken line B the result for the SAW device 105, the one-dot chain line C the result for the SAW device 106, and the two-dot chain line the result for the SAW device 108.

It is evident from FIG. 24 that, by selecting $H/\lambda$ values, larger electromechanical coupling coefficients can be obtained in the SAW devices 105 and 108 than in the SAW devices 101 and 106.

Therefore, it has previously been considered that, in the structure wherein the ZnO thin film 103 is disposed on the glass substrate 102, larger electromechanical coupling coefficients can be obtained by providing IDTs 104 on the interface between the glass substrate 102 and the ZnO thin film 103. Here, waves marked as "Sezawa waves" in FIG. 24 are surface acoustic waves in higher order modes of the Rayleigh wave.

Meanwhile, the inventor of the present application has shown various characteristics of surface acoustic waves when using a surface acoustic wave substrate constructed by forming a ZnO thin film on a quartz substrate, in the IEEE ULTRASONICS SYMPOSIUM (1997), pp. 261–266, and in the Japan Society for the Promotion of Science, the Surface Acoustic Wave Device Technique 150th Committee, the 59th data for study (1988) pp. 23–28 (hereinafter abbreviated as Literature 1). These characteristics will be described with respect to FIGS. 25A and 25B, and FIG. 26. In this prior art, it has been confirmed by a theory and experiments that a surface acoustic substrate of which the temperature coefficient of frequency, TCF is zero, can be obtained by forming a ZnO thin film which has a negative TCF value, on a quartz substrate which has a cut angle and a propagation direction which provide a positive TCF value.

Here, the theory in Literature 1 is based upon IEEE Trans. Sonics & Ultrason. vol. SU-15, No. 4 (1968) p. 209.

FIG. 25A shows the ZnO film-thickness dependence of the TCF of the SAW device shown in FIG. 22A, when using the quartz substrate of 29°45' rotating Y plate, 35° X propagation [Euler angles (0°, 119°45', 35°)], the quartz substrate being described in the Literature 1. FIG. 25B shows the ZnO film-thickness dependence of the TCF of the SAW device shown in FIG. 22A, when using the quartz substrate of 42°45' rotating Y plate, 35° X propagation [Euler angles (0°, 132°45', 35°)], the quartz substrate being described in the Literature 1. FIG. 26 shows electromechanical coupling coefficients for the Rayleigh wave and Sezawa wave which is a spurious wave, in a SAW device which uses a ZnO thin film as the piezoelectric thin film, and a quartz substrate as the elastic substrate. The solid lines A through C in FIG. 26 shows electromechanical coupling coefficients for the Rayleigh wave in the SAW devices having the structures shown in FIGS. 22A, 22B, and 23A, respectively. The broken lines A", C", and D" show variations in the electromechanical coupling coefficient for the Sezawa wave which constitutes a spurious wave in the SAW device having the structures shown in FIGS. 22A, 23A, and 23B, respectively.

It can be seen from FIGS. 25A and 25B that, in the SAW device shown in FIG. 22A, the TCF becomes zero by selecting normalized ZnO film thicknesses.

Table 1 below shows the comparison between the SAW device (laminated structure of Al/ZnO/quartz) which is shown in FIG. 22A and which is described in the prior art, and the conventional known SAW device which has a small TCF value.

TABLE 1

| SUBSTRATES | EULER ANGLES OF SUBSTRATES | SONIC SPEEDS (m/s) | $K^2$ (%) | TEMPERATURE DEVIATIONS OF FREQUENCY AT -20° C. TO 80° C. (ppm/° C.) |
|---|---|---|---|---|
| Al/ST-X QUAURTZ | (0°, 132° 45', 0°) | 3158 | 0.14 | 0.9 |
| Al/La$_3$Ga$_5$SiO$_{14}$ | (0°, 143°, 24°) | 2756 | 0.42 | 1.63 |
| Al/Li$_2$B$_4$O$_7$ | (110°, 90°, 90°) | 3480 | 1 | 6.8 |
| Al/ZnO/ QUARTZ | (0°, 119° 45', 35°) (0°, 132° 45', 35°) | 2900 | 1.0 to 1.1 | 1.1 |

It is observed from FIG. 26 and Table 1 that the SAW device shown in FIG. 22A provides an electromechanical coupling coefficient $K^2$ of about 1%, which is larger than those of the ST-X quartz substrate and the La$_3$Ca$_5$SiO$_{14}$ substrate, and that this SAW device provides a sound speed lower by about 20% than the Li$_2$B$_4$O$_7$ substrate which has an electromechanical coupling coefficient $K^2$ equivalent thereto. This means that, when forming a transversal type SAW filter using the SAW device shown in FIG. 22A, this SAW filter is lower in the loss than that in the cases of the ST-X quartz substrate and the La$_3$Ca$_5$SiO$_{14}$ substrate, and that the SAW filter is smaller in the size and in the frequency deviation due to temperature than those in the case of the Li$_2$B$_4$O$_7$ substrate.

Meanwhile, FIG. 26 shows that, when using a ZnO thin film as the piezoelectric thin film, and a quartz substrate as the elastic substrate, the electromechanical coupling coefficient for the Rayleigh wave in the SAW device shown in FIG. 22B is smaller than that in the SAW device shown in FIG. 22A and FIG. 23A. This tendency runs counter to the tendency in the case where a glass substrate is used as the elastic substrate.

In this way, since each of the SAW devices shown in FIG. 22A and FIG. 23A combines a small TCF with a large electromechanical coupling coefficient, an improvement in the performance of a surface acoustic wave device such as a band-pass filter for use in mobile communication equipment can be achieved by using these SAW devices.

However, there is a problem that even the SAW devices shown in FIG. 22A and FIG. 23A are still lacking in the electromechanical coupling coefficient, and that they cannot sufficiently satisfy characteristics required of the surface acoustic wave device. Mobile communications scheme is being shifted from the conventional analog scheme to the digital scheme, and further to the code spreading scheme. For example, an intermediate frequency filter used for the digital scheme or the code spreading scheme requires a low group delay deviation and a low insertion loss. As a band-pass filter formed using a surface acoustic wave device which has a low group delay deviation, a transversal type filter is known. However, when the transversal type filter is formed using a conventional surface acoustic wave substrate, this filter lacks a sufficient electromechanical coupling coefficient, so that it cannot meet the above-mentioned requirement.

SUMMARY OF THE INVENTION

In order to overcome the problems described above, preferred embodiments of the present invention provide a SAW device which has superior temperature characteristics and a very large electromechanical coupling coefficient, the SAW device using a surface acoustic wave substrate formed by laminating a piezoelectric thin film on a quartz substrate.

According to a preferred embodiment of the present invention, a surface acoustic wave device includes a quartz substrate, a piezoelectric thin film disposed on the quartz substrate, and comb electrodes disposed between the quartz substrate and the piezoelectric thin film. In this surface acoustic wave device, the normalized film thickness of the piezoelectric thin film $H/\lambda$ is at least about 0.05, when the film thickness of the piezoelectric thin film is H, and the wavelength of a surface acoustic wave is $\lambda$.

In another preferred embodiment of the present invention, it is preferred that the normalized film thickness of the piezoelectric thin film $H/\lambda$ is at least about 0.20.

In another preferred embodiment of the present invention, the piezoelectric thin film is arranged so as to contact the substrate and/or the comb electrodes at the negative surface thereof.

In still another preferred embodiment of the present invention, there is further provided a short-circuit electrode disposed on the piezoelectric thin film.

In a further particular preferred embodiment of the present invention, the Euler angles of the quartz substrate are within the range such that the power flow angle PFA of the Rayleigh wave shown in FIG. 6, is within approximately ±2.50.

In a yet further preferred embodiment of the present invention, the Euler angles of the quartz substrate are within the range such that the temperature coefficient of frequency, TCF of the surface acoustic wave device shown in FIG. 7, is within approximately ±25 ppm/° C.

In another particular preferred embodiment of the present invention, the Euler angles of the quartz substrate are within the range such that the temperature coefficient of frequency, TCF of the surface acoustic wave device shown in FIG. 7 is within approximately ±5 ppm/° C.

In still another particular preferred embodiment of the present invention, the Euler angles of the quartz substrate are within the range such that the electromechanical coupling coefficient for the Rayleigh wave, $K^2$ shown in FIG. 8, is not smaller than about 0.8%.

In a further particular preferred embodiment of the present invention, the Euler angles of the quartz substrate are within the range such that the electromechanical coupling coefficient for the spurious wave, $K_{sp}^2$ shown in FIG. 9, is not larger than about 0.1%.

In a yet further preferred embodiment of the present invention, the temperature coefficient of frequency, TCF of the piezoelectric thin film has a negative value.

In another particular preferred embodiment of the present invention, the Euler angles of the quartz substrate are in the range such that the difference in the power flow angle, $\Delta$PFA between the surface acoustic wave to be utilized and a unwanted surface acoustic wave not to be utilized shown in FIG. 18, is within approximately ±1°.

In various preferred embodiments of the present invention, the piezoelectric thin film is preferably formed of a kind of material selected from the group consisting of ZnO, AlN, Ta$_2$O$_5$, and CdS.

The above and other features, elements, characteristics and advantages of the present invention will be clear from the following detailed description of the preferred embodiments of the invention in conjunction with the accompanying drawings.

BRIEF DESCRIPTION OF THE DRAWINGS

FIGS. 1A and 1B are schematic construction views for explaining a surface acoustic wave device in accordance with a preferred embodiment of the present invention, wherein FIG. 1A is a plan view and FIG. 1B is a sectional view of the main section thereof;

DETAILED DESCRIPTION OF PREFERRED EMBODIMENTS

Figure 1A:
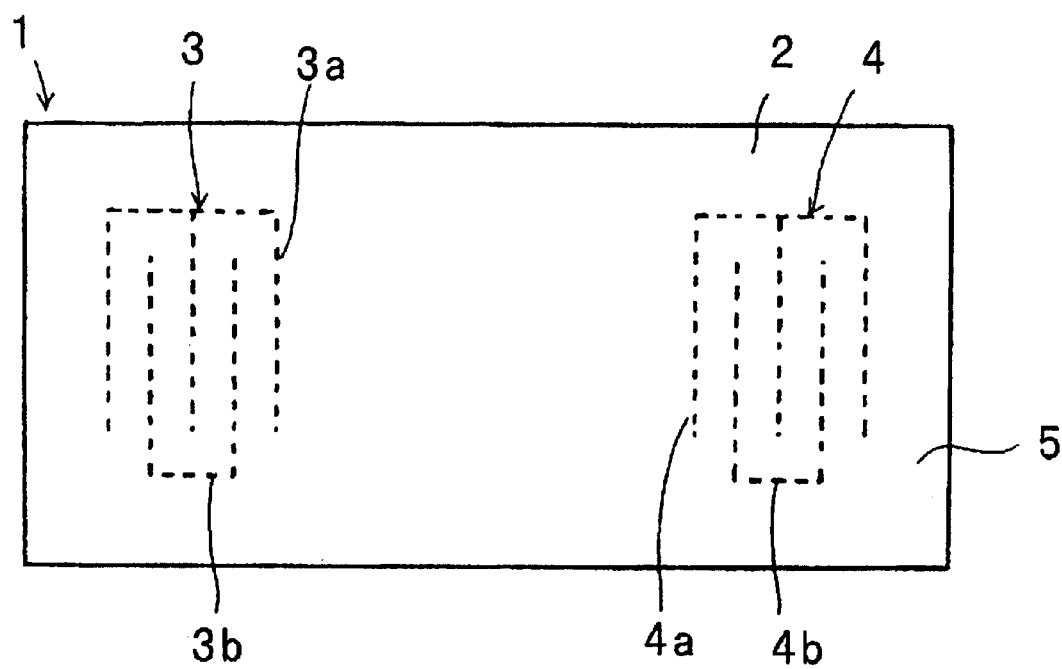
Figure 1B:
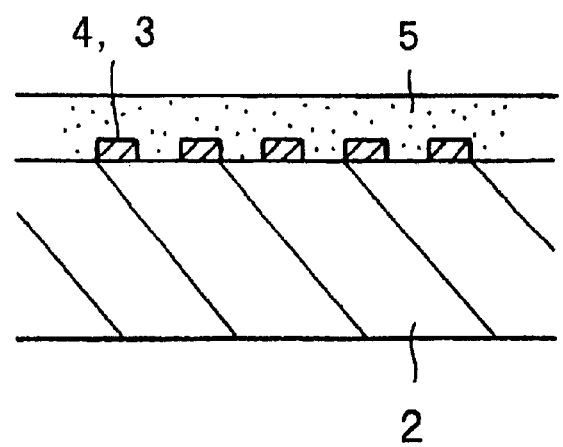

FIGS. 1A and 1B are views showing a surface acoustic wave device in accordance with a preferred embodiment of the present invention, wherein FIG. 1A is a plan view and FIG. 1B is a sectional view of the main section.

In this surface acoustic wave device 1, interdigital transducers (IDTs) 3 and 4 are disposed on a quartz substrate 2.

The IDTs 3 and 4 have pairs of comb electrodes 3a and 3b, and 4a and 4b, respectively. The IDTs 3 and 4 are arranged along the propagation direction of a surface acoustic wave with a predetermined interval therebetween. That is, in the surface acoustic wave device 1 in accordance with this preferred embodiment, the IDTs 3 and 4 are arranged as in the case of a well-known transversal type surface acoustic wave filter.

This preferred embodiment is characterized in that a piezoelectric thin film 5 is laminated so as to cover the IDTs 3 and 4, and that the normalized film thickness H/λ of the piezoelectric thin film 5 is preferably at least about 0.05, when the film thickness of the piezoelectric thin film 5 is H, and the wavelength of a surface acoustic wave is λ. This increases the electromechanical coupling coefficient $K^2$ of this preferred embodiment, and improves the temperature characteristics thereof. Hereinafter, this will be described in more detail.

Figure 22A:
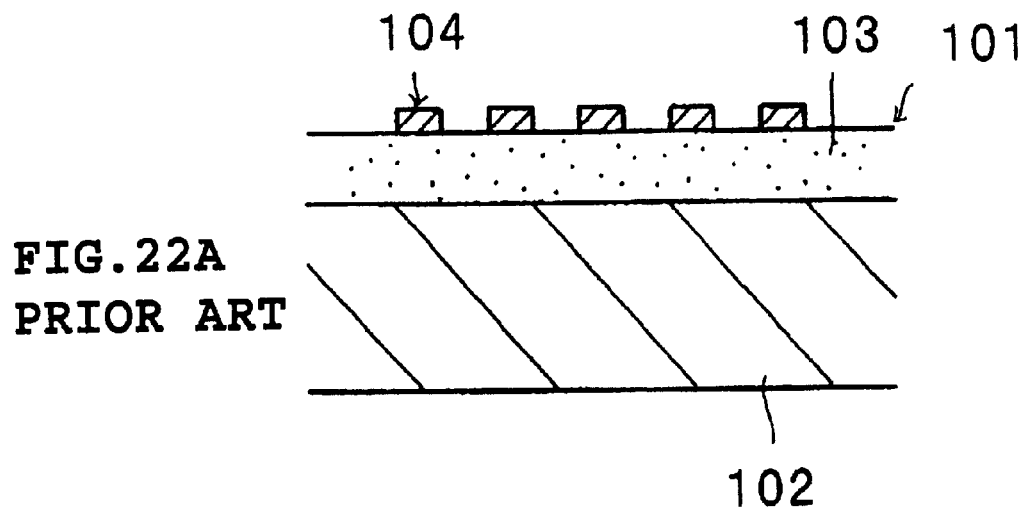
FIGS. 22A and 22B are schematic sectional views for explaining examples of laminated structures each of which is formed of a substrate, a piezoelectric thin film, and comb electrodes in the surface acoustic wave device.
Figure 22B:
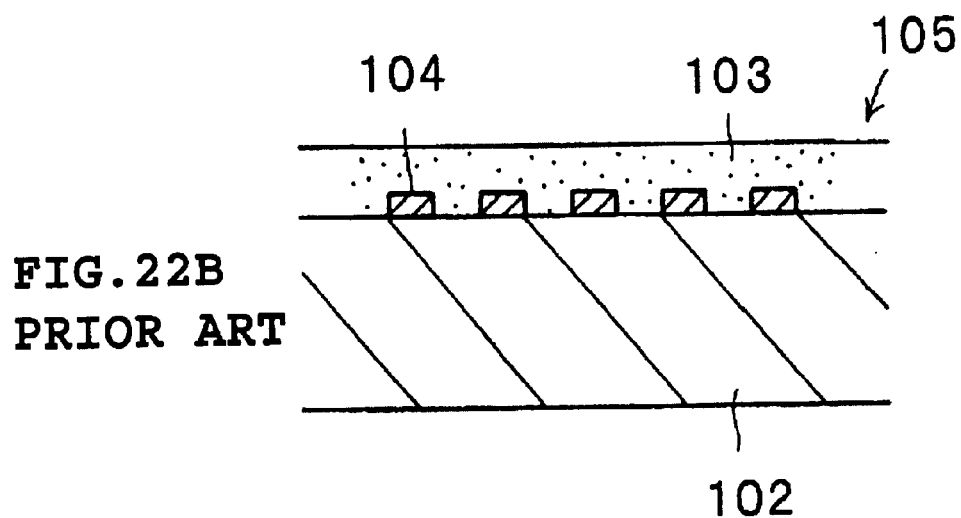
Figure 23A:
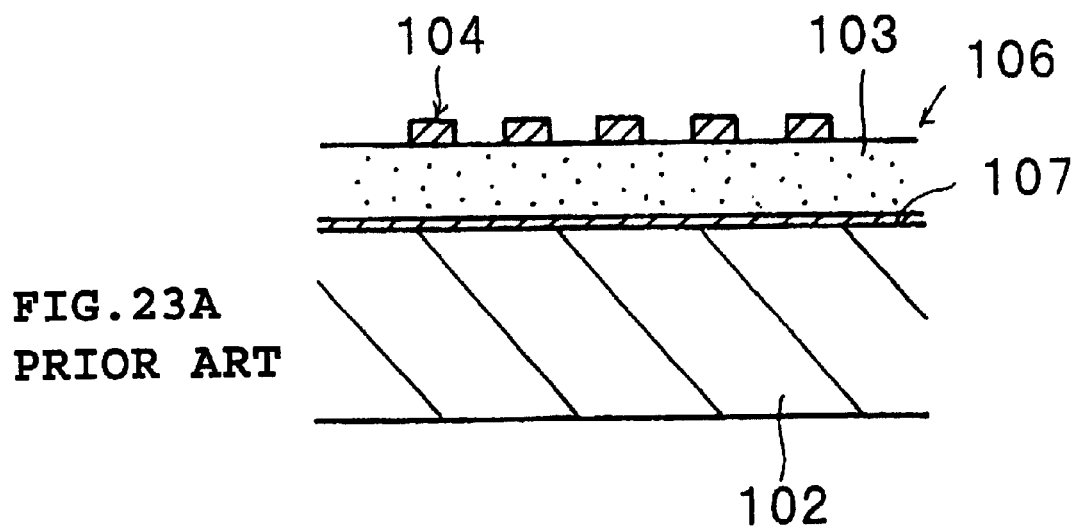
FIGS. 23A and 23B are schematic sectional views for explaining examples of laminated structures each of which is formed of a substrate, a piezoelectric thin film, and comb electrodes in the surface acoustic wave device.
Figure 23B:
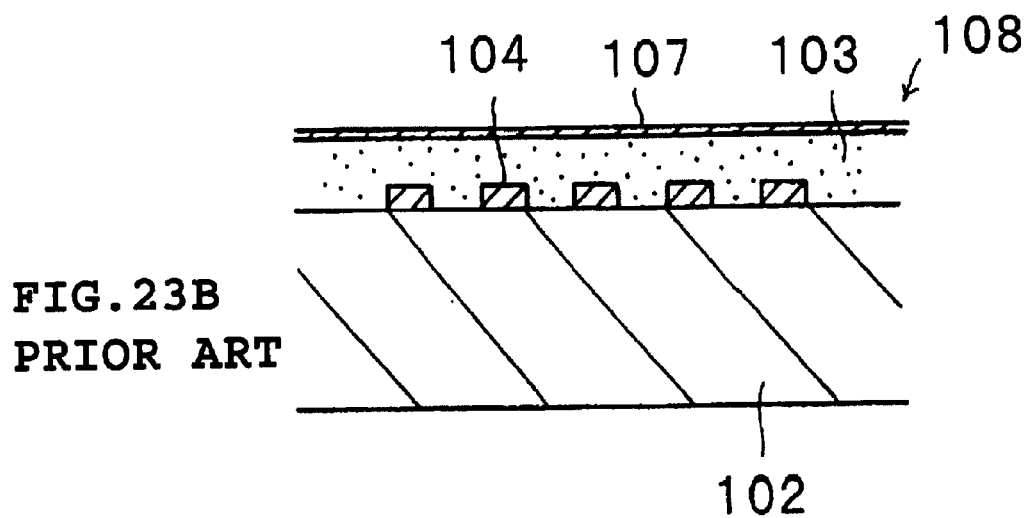

Concerning the characteristics of the surface acoustic wave device which uses a quartz substrate as the elastic substrate, and which uses a surface acoustic wave substrate constructed by forming a ZnO thin film as a piezoelectric thin film on the quartz substrate, and particularly concerning the characteristics of the above-described surface acoustic wave devices having the laminate structures shown in FIG. 22B and FIG. 23B, the inventors of this application have studied from an angle other than that of the above-described prior art, while doubting that these characteristics run counter to the tendency in the case where a glass substrate is used as the elastic substrate.

Figure 2:
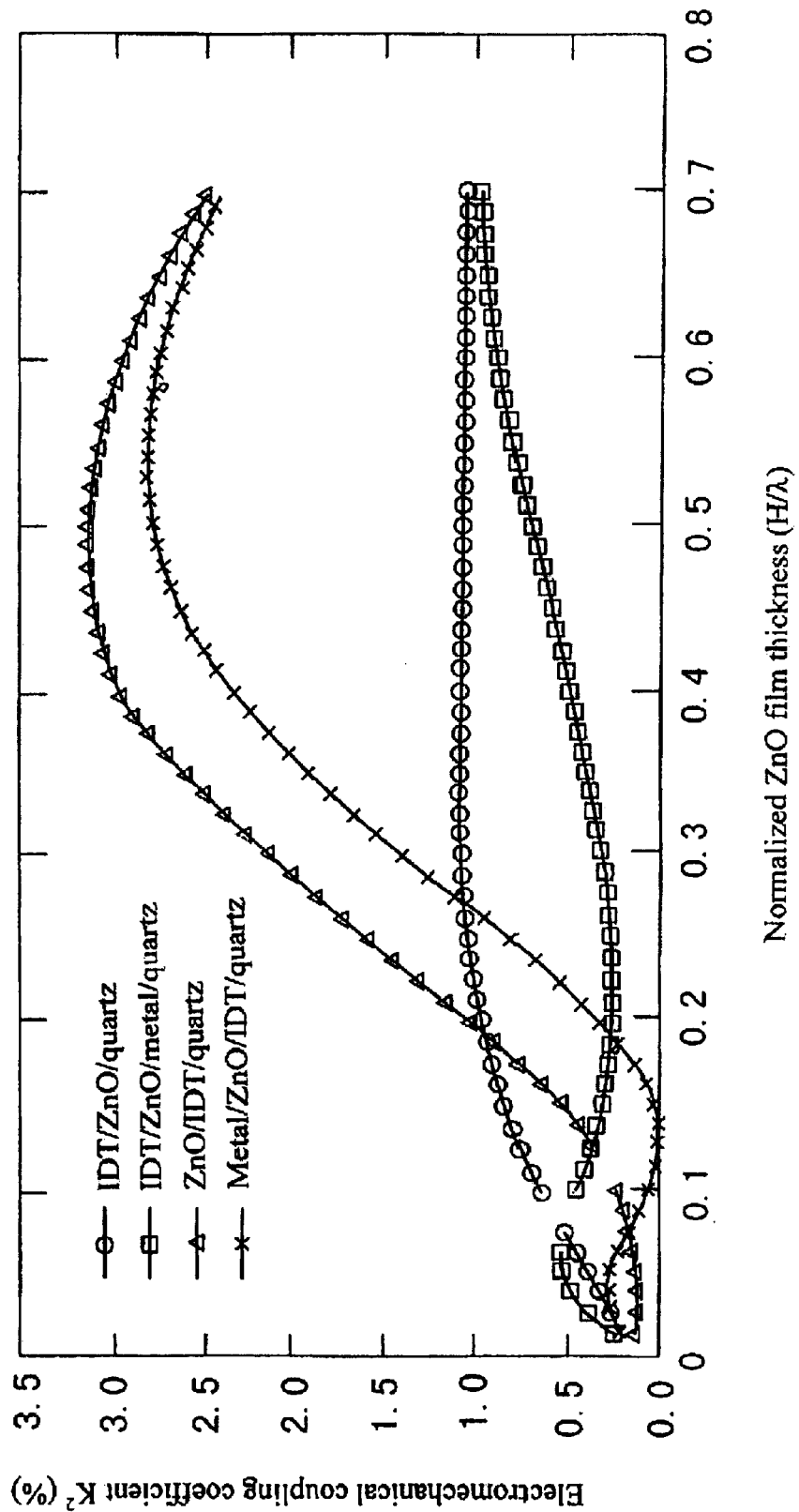
FIG. 2 is a diagram showing the relationship between the ZnO film thickness normalized by the Rayleigh wavelength and the electromechanical coupling coefficient for the Rayleigh wave, $K^2$ when a ZnO film with Euler angles (0°, 0°, 0°) is formed on a quartz substrate with Euler angles (0°, 119.75°, 35°) in each of the SAW devices of various laminated structures.
Figure 3:
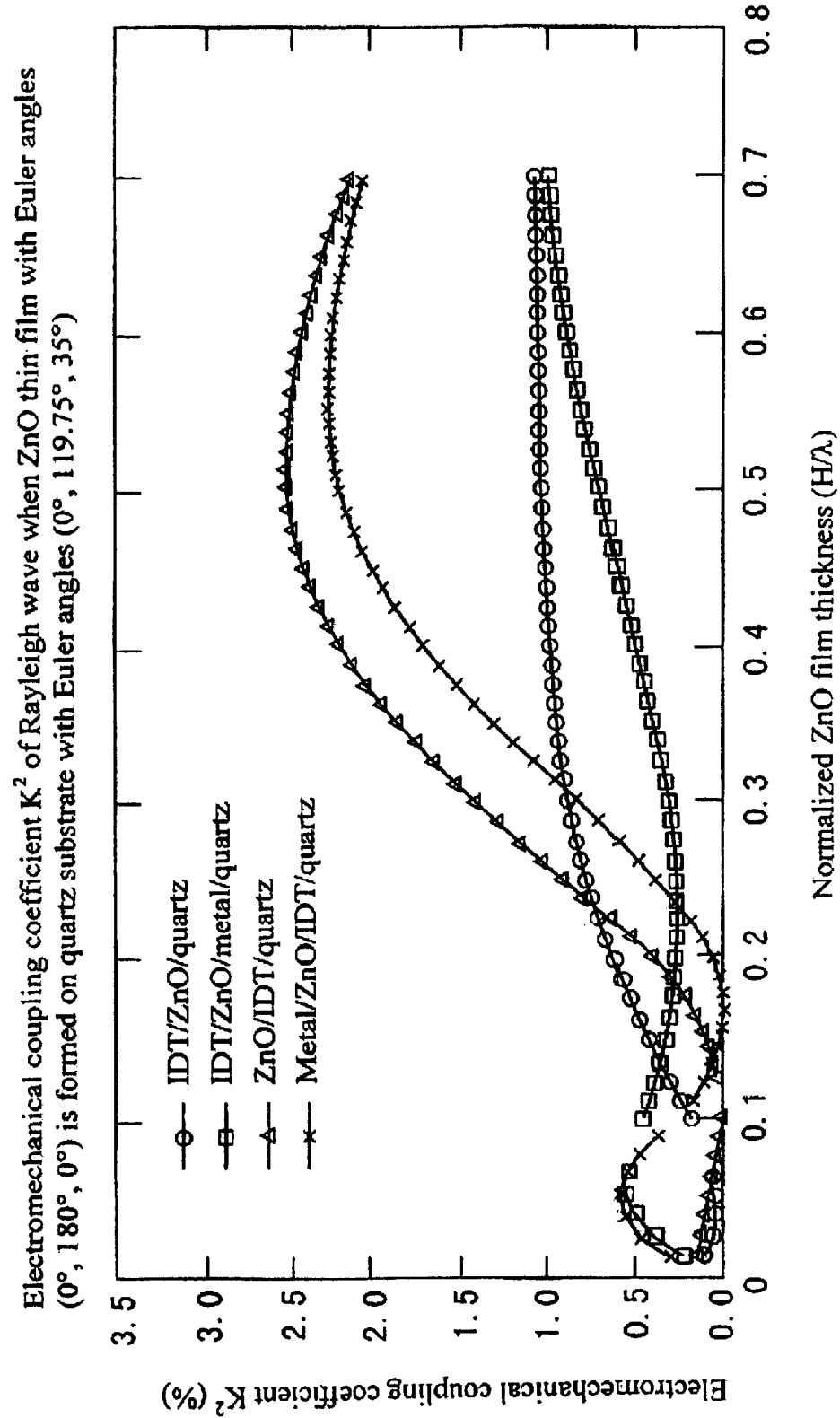
FIG. 3 is a diagram showing the relationship between the ZnO film thickness normalized by the Rayleigh wavelength and the electromechanical coupling coefficient for the Rayleigh wave, $K^2$ when a ZnO film with Euler angles (0°, 180°, 0°) is formed on a quartz substrate with Euler angles (0°, 119.75°, 35°) in each of the SAW devices of various laminated structures.
Figure 4:
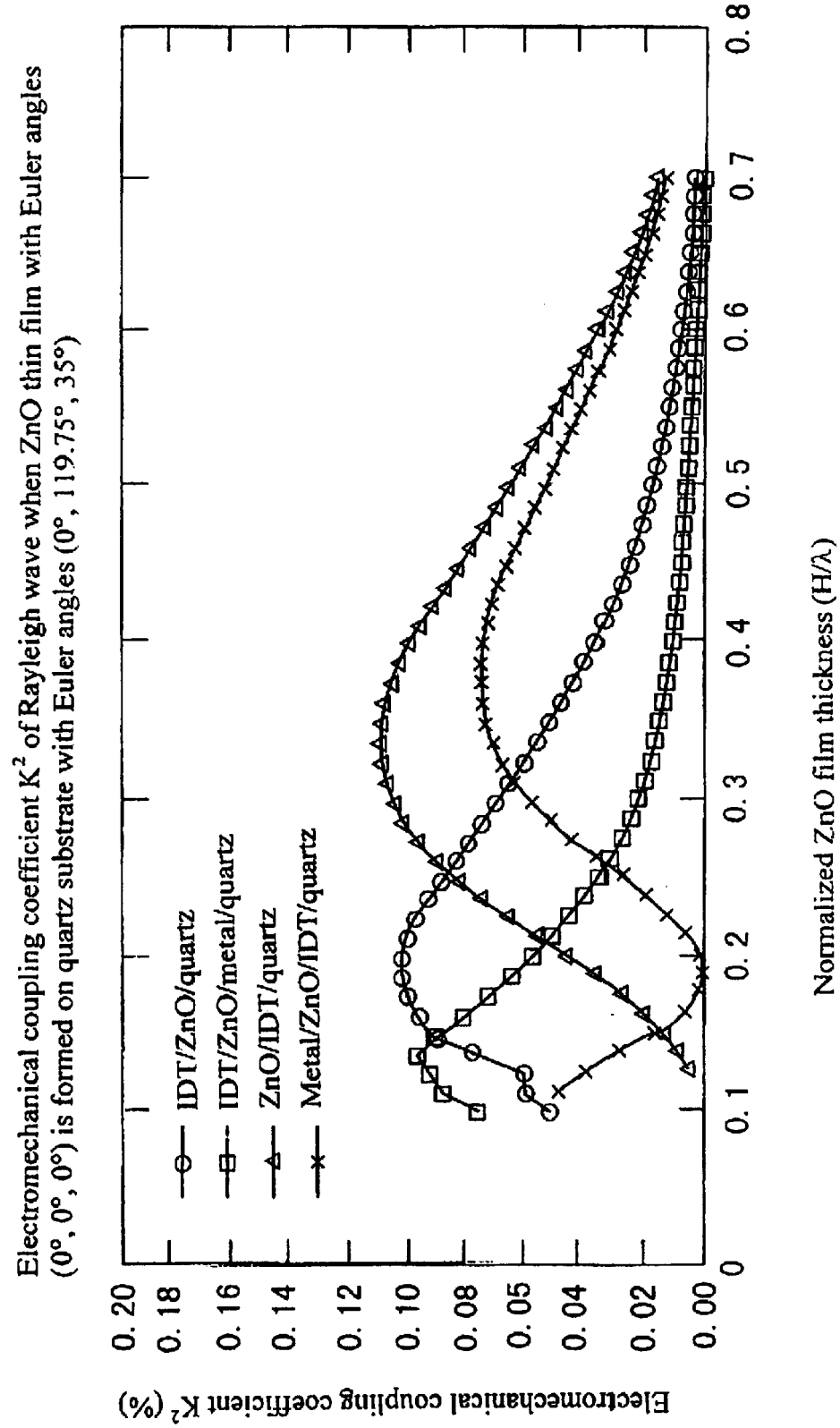
FIG. 4 is a diagram showing the relationship between the ZnO film thickness normalized by the Rayleigh wavelength and the electromechanical coupling coefficient for a spurious wave, $K_{sp}^2$ when a ZnO film with Euler angles (0°, 0°, 0°) is formed on a quartz substrate with Euler angles (0°, 119.75°, 35°) in each of the SAW devices of various laminated structures.
Figure 5:
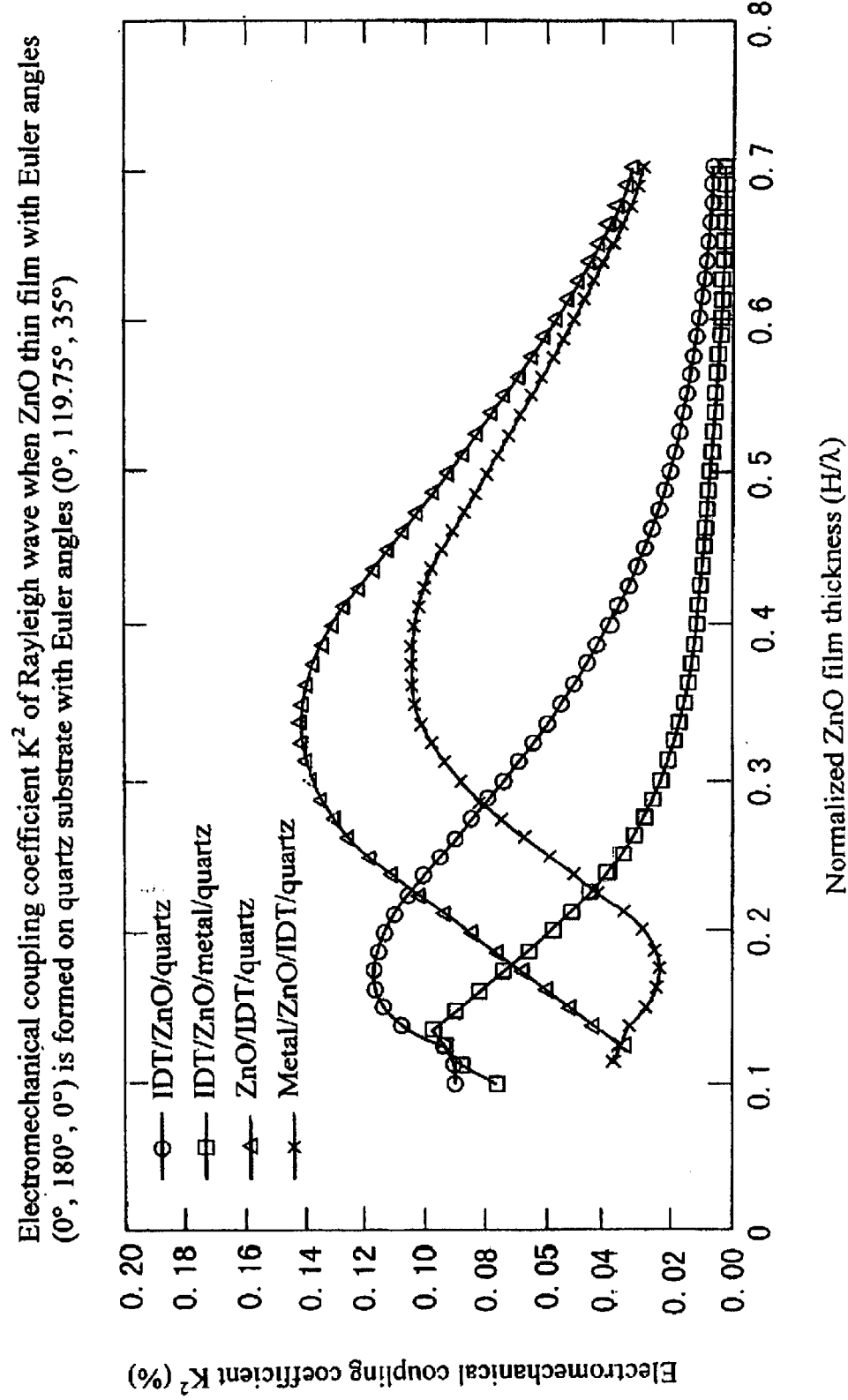
FIG. 5 is a diagram showing the relationship between the ZnO film thickness normalized by the Rayleigh wavelength and the electromechanical coupling coefficient for the spurious wave, $K_{sp}^2$ when a ZnO film with Euler angles (0°, 180°, 0°) is formed on a quartz substrate with Euler angles (0°, 119.75°, 35°) in each of the SAW devices of various laminated structures.

FIGS. 2 and 3 show the relationship between the ZnO normalized film thickness and the electromechanical coupling coefficient when a ZnO film is used as a piezoelectric thin film, and X propagation quartz substrate having Euler angles (0°, 119.45°, 35°) is used as an elastic substrate, for the Rayleigh wave propagating through each of the SAW devices having the structures shown in FIGS. 22A and 22B, and FIGS. 23A and 23B. FIGS. 4 and 5 show the relationship between the ZnO normalized film thickness and the electromechanical coupling coefficient, for the spurious wave occurring in the vicinity of the Rayleigh wave.

In FIGS. 2 and 4, the Euler angles of the ZnO thin film is preferably set to (0°, 0°, 0°), and in FIGS. 3 and 5, the Euler angles of the ZnO thin film is preferably set to (0°, 180°, 0°), that is, the polarity of the ZnO is reversed.

Here, the results shown in FIGS. 2 through 5 were obtained by utilizing a finite-element method proposed in a literature (Transactions of Institute of Electronics and Communication Engineers of Japan, Vol. J68-C No. 1 (1985), pp. 21–27), instead of the method by Cambell et al described in the above-described prior art. The electromechanical coupling coefficient $K^2$ was determined by the following equation (1), after the sound speed on a free surface, Vf and the sound speed on a short-circuited surface, Vm have been derived using the above-mentioned finite-element method.

$$K^2 = 2 \times (Vf - Vm)/Vf \tag{1}$$

In FIGS. 2 through 5, if the thickness of the ZnO thin film for the Rayleigh wave in the SAW device shown in FIG. 22B exceeds about 0.05 λ, the electromechanical coupling coefficient $K^2$ will become larger than those in the case where no ZnO thin film is formed.

If the thickness of the above-described ZnO thin exceeds the range from about 0.20 λ to about 0.24 λ, the electromechanical coupling coefficient for the Rayleigh wave, $K^2$ in the SAW device shown in FIG. 22B will become larger than those for the Rayleigh wave in the SAW devices shown in FIG. 22A and FIGS. 23A and 23B. In particular, in the vicinity of about 0.5 λ of the thickness of ZnO thin film, the electromechanical coupling coefficient for the Rayleigh wave of the SAW device shown in FIG. 22B will amount to triple as much as that for the Rayleigh wave of the SAW device shown in FIG. 22A.

Also, if the thickness of the ZnO thin film exceeds the range from about 0.27 λ to about 0.31 λ, the electromechanical coupling coefficient $K^2$ for the Rayleigh wave of the SAW device shown in FIG. 23B will become larger than those for the Rayleigh wave of the SAW devices shown in FIG. 22A and FIG. 23A.

Figure 24:
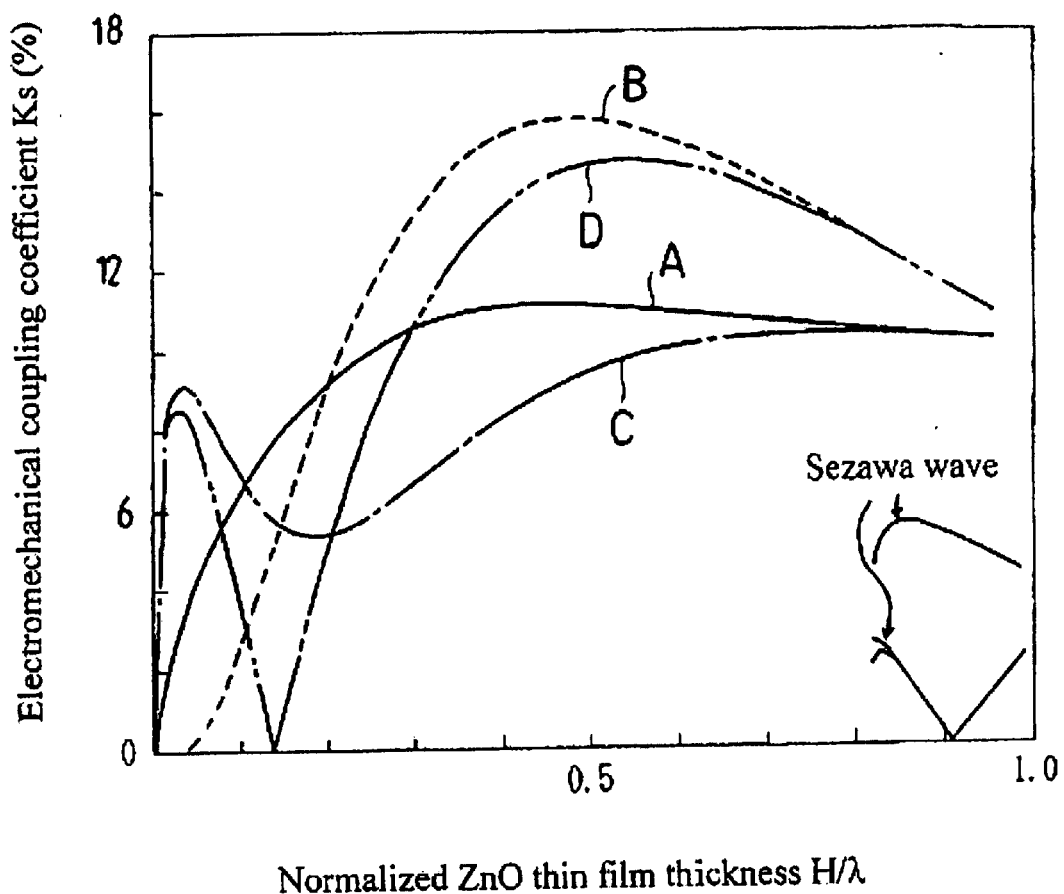
FIG. 24 is a diagram showing the relationship between the normalized film thickness of ZnO thin film and the electromechanical coupling coefficient ks in a conventional surface acoustic wave device.
Figure 25A:
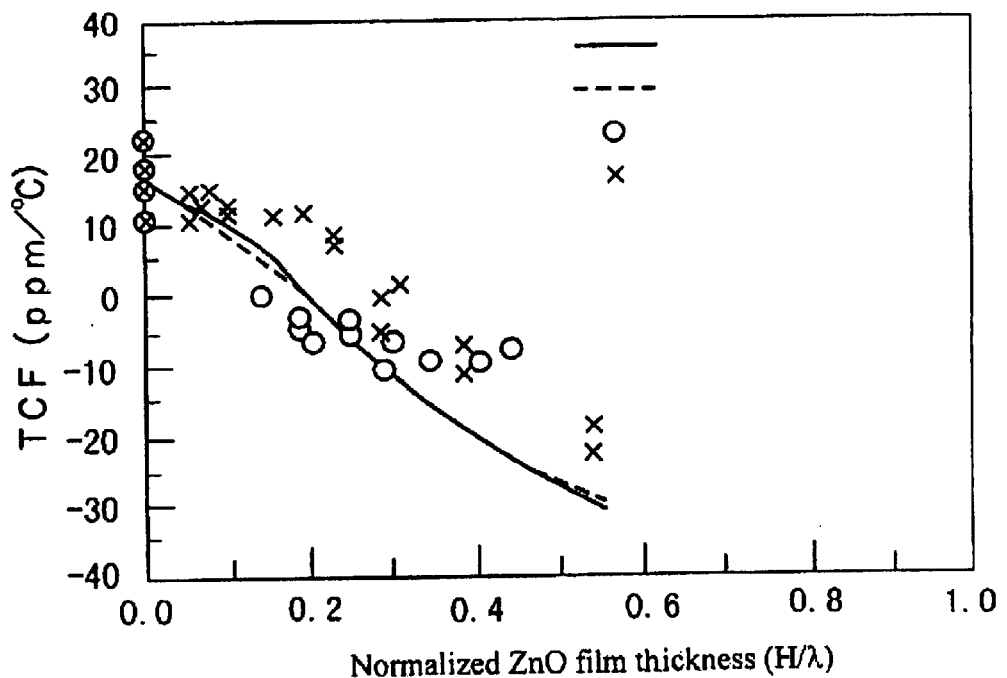
FIGS. 25A and 25B are diagrams showing the dependence of the temperature coefficient of frequency, TCF upon the ZnO film thickness in the surface acoustic wave device described in the prior art.
Figure 25B:
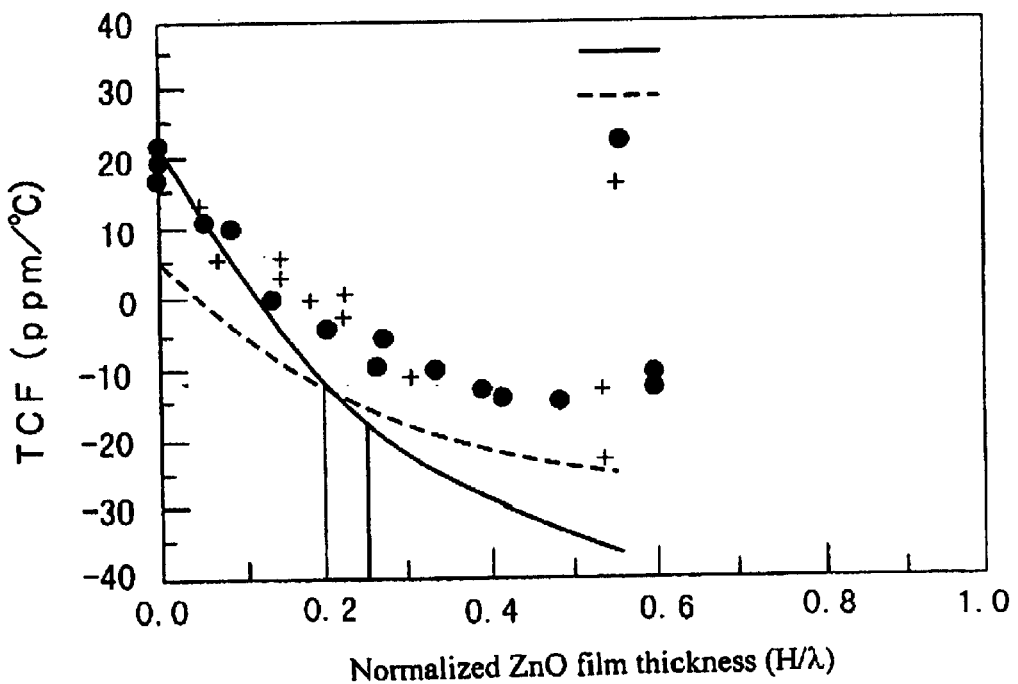
Figure 26:
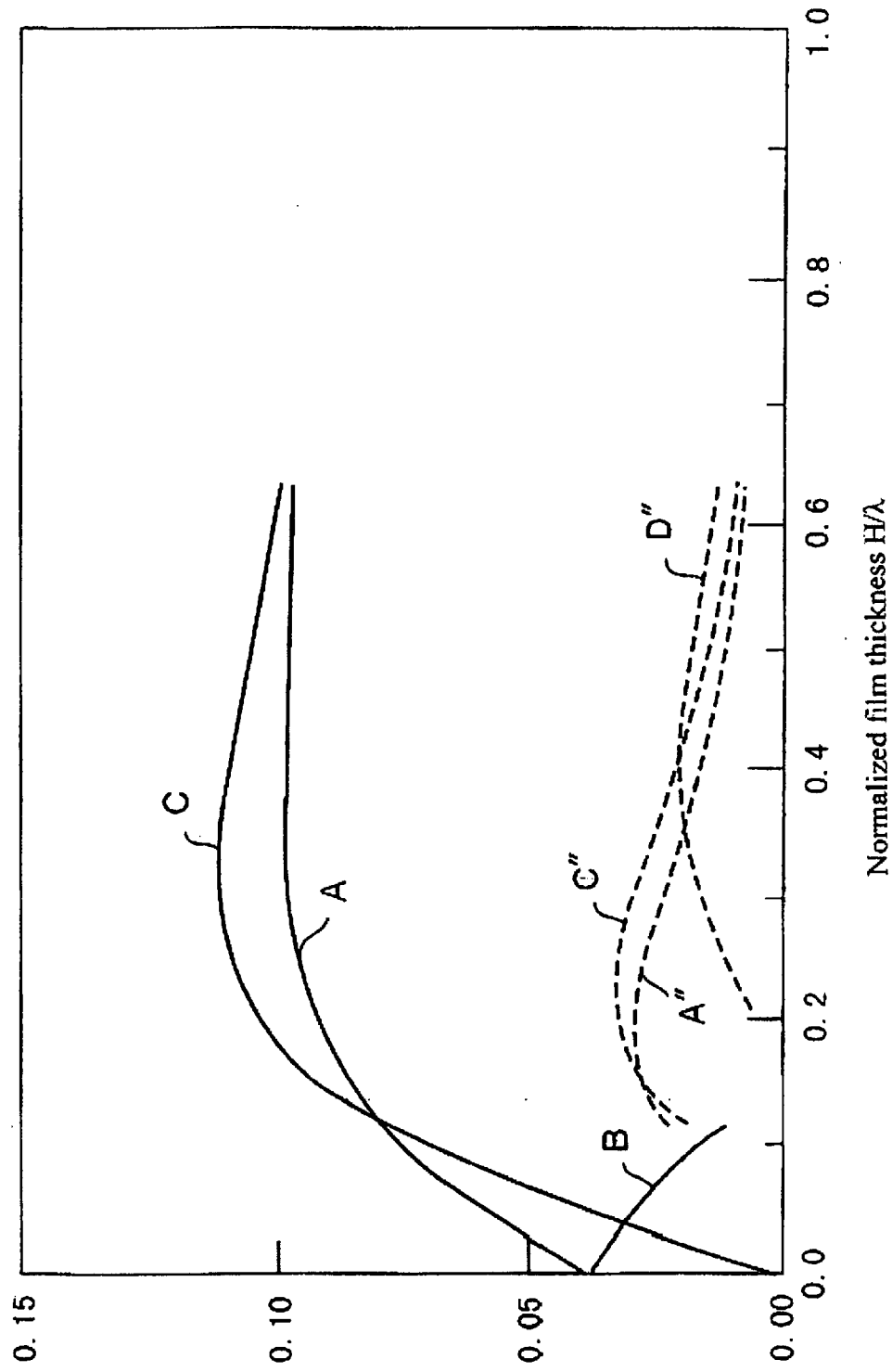
FIG. 26 is a diagram showing the relationship between the normalized film thickness H/λ of ZnO and the electromechanical coupling coefficient, the relationship being described in the prior art.

The above calculation results are similar to the results shown in FIG. 24 in the case where a glass substrate is used as the elastic substrate, and has a different tendency from the theoretical values in FIG. 25 which are described in the above-described Literature 1.

As a general tendency, when the Euler angles are set to (0°, 0°, 0°), the electromechanical coupling coefficient for the Rayleigh wave, $K^2$ is larger than that in the case where the Euler angles are set to (0°, 180°, 0°), while the electromechanical coupling coefficient for the spurious wave, $K_{sp}^2$ is smaller than that in the case where the Euler angles are set to (0°, 180°, 0°).

It can be recognized from the above calculations that the electromechanical coupling coefficient $K^2$ can be significantly increased by using a surface acoustic wave substrate constructed by forming a ZnO thin film on the quartz substrate, in each of the SAW surface acoustic wave devices having the structures shown in FIGS. 22B and 23B.

Meanwhile, the representative evaluation items for the surface acoustic wave substrate includes the power flow angle PFA and the temperature coefficient of frequency TCF, in addition to the electromechanical coupling coefficient $K^2$. Furthermore, in each of the SAW devices which have laminate structures shown in FIGS. 22A through 23B and each of which uses a ZnO thin film as the piezoelectric thin film and a quartz substrate as the elastic substrate, a spurious wave occur which have a sound speed of about 110% of that of the Rayleigh wave, and hence the electromechanical coupling coefficient for the spurious wave, $K_{sp}^2$ also constitutes an important evaluation item.

That is, it is desirable that the surface acoustic substrate have small values of PFA, TCF, and $K_{sp}^2$.

Accordingly, in the SAW device having the structure in FIG. 22B which uses a ZnO thin film as the piezoelectric thin film and a quartz substrate as the elastic substrate, that is, in the SAW device having the same structure as that shown in FIG. 1B, the relationships among the Euler angles (0°, θ, ψ) of the quartz substrate, the thickness of the ZnO thin film, the power flow angle PFA of the Rayleigh wave, the temperature coefficient of frequency, TCF, the electromechanical coupling coefficient for the Rayleigh wave, $K^2$, and the electromechanical coupling coefficient for the spurious wave, $K_{sp}^2$ were calculated using the finite-element method. The Results will be described with reference to FIGS. 6 through 9, FIGS. 10 through 13, and FIGS. 14 through 17.

Figure 6:
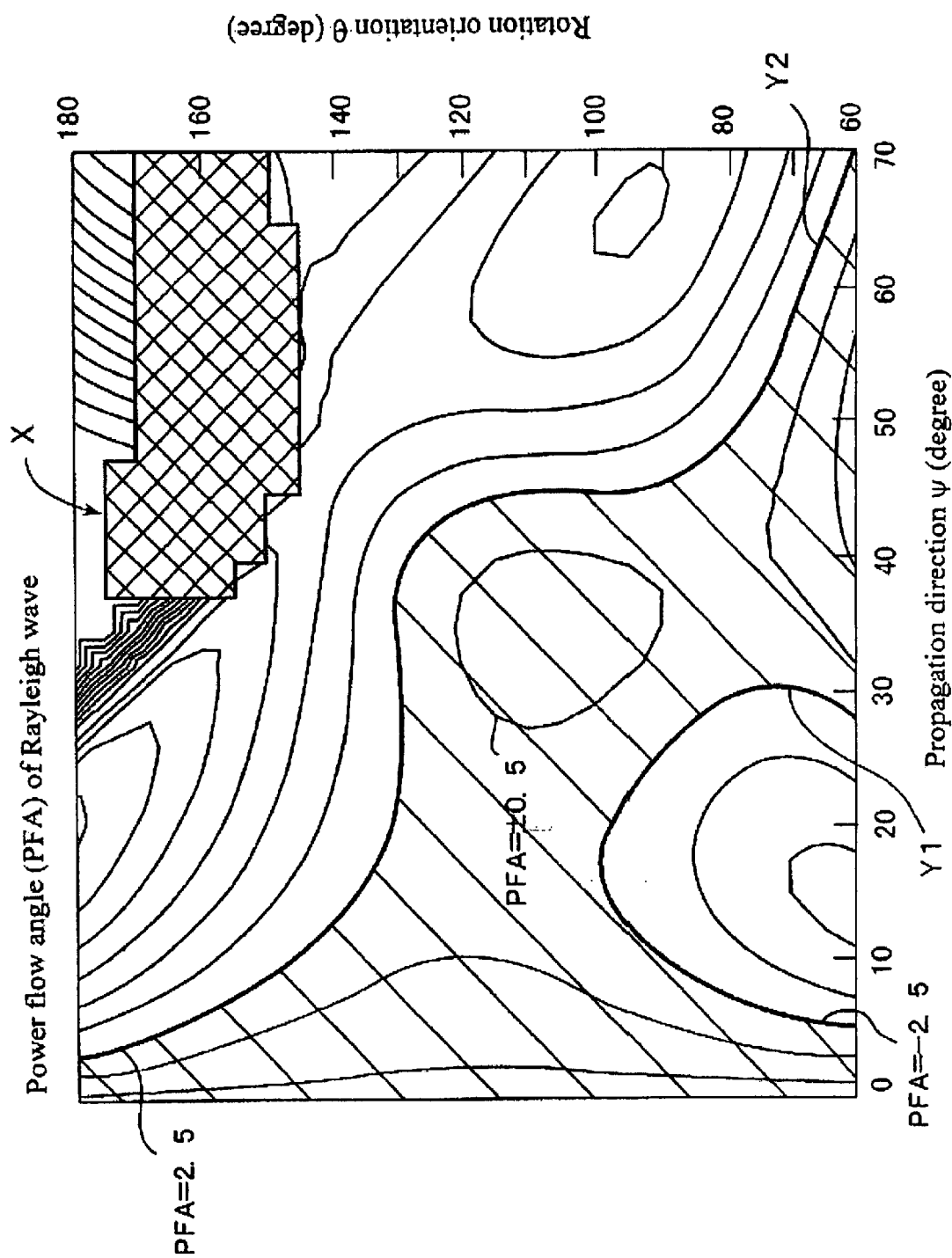
FIG. 6 is a diagram showing the substrate-orientation dependence of the power flow angle of the Rayleigh wave when the normalized film thickness of ZnO is about 0.20.

FIGS. 6 through 9 are diagrams each showing the substrate-orientation dependence of the surface acoustic wave which propagates through a ZnO/Al/quartz substrate, wherein the normalized film thickness of the ZnO is preferably about 0.20. FIG. 6 shows power flow angles of the Rayleigh wave, FIG. 7 temperature coefficients of frequency, TCF for the Rayleigh wave, FIG. 8 electromechanical coupling coefficients for the Rayleigh wave, $K^2$ and FIG. 9 orientation dependence of the electromechanical coupling coefficients for the spurious wave, $K_{sp}^2$.

The contour lines shown in FIGS. 6 through 9 correspond to the above-described power flow angle PFA, the temperature coefficient of frequency, TCF, and the electromechanical coupling coefficients $K^2$ and $K_{sp}^2$, respectively, and mean that all points on each of these lines are equal in the respective values. FIGS. 10 through 13, and FIGS. 14 through 17 also exhibit similar results to those in FIG. 6 through FIG. 9, but the normalized film thickness of ZnO film is preferably about 0.25 in FIG. 13, and about 0.30 in FIGS. 14 though 17.

In FIGS. 6 through 17, regions which is hatched with crossed slashes and which is indicated by X with an arrow, is in the condition in which calculation values could not obtained due to small electromechanical coupling coefficients $K^2$ or the like. The values of PFAs and TCFs shown in the FIGS. 6, 10, 14, and FIGS. 7, 11, and 15 were determined by the following equations (2) and (3), respectively.

$$PFA = \tan^{-1}(Vf^{-1} \times \partial Vf/\partial \psi) \quad (2)$$

$$TCF = Vf^{-1} \times \partial Vf/\partial T - \alpha \quad (3)$$

In equation (2), ψ is the propagation direction (degree) of a surface acoustic wave, T is a temperature (° C.), and α is the thermal expansion coefficient in the propagation direction of the surface acoustic wave.

Figure 10:
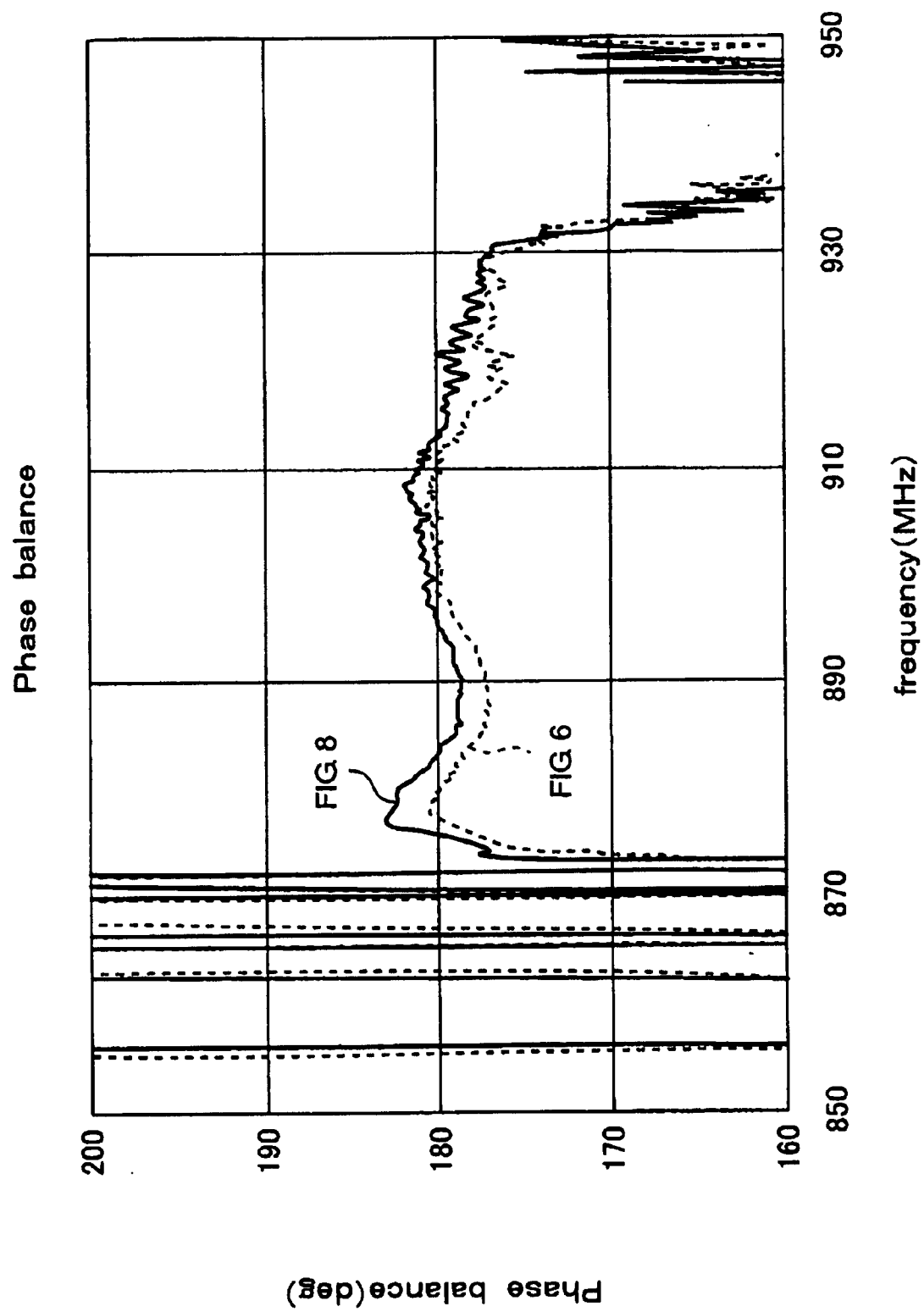
FIG. 10 is a diagram showing the substrate-orientation dependence of the power flow angle of the Rayleigh wave when the normalized film thickness of ZnO is about 0.25.
Figure 14:
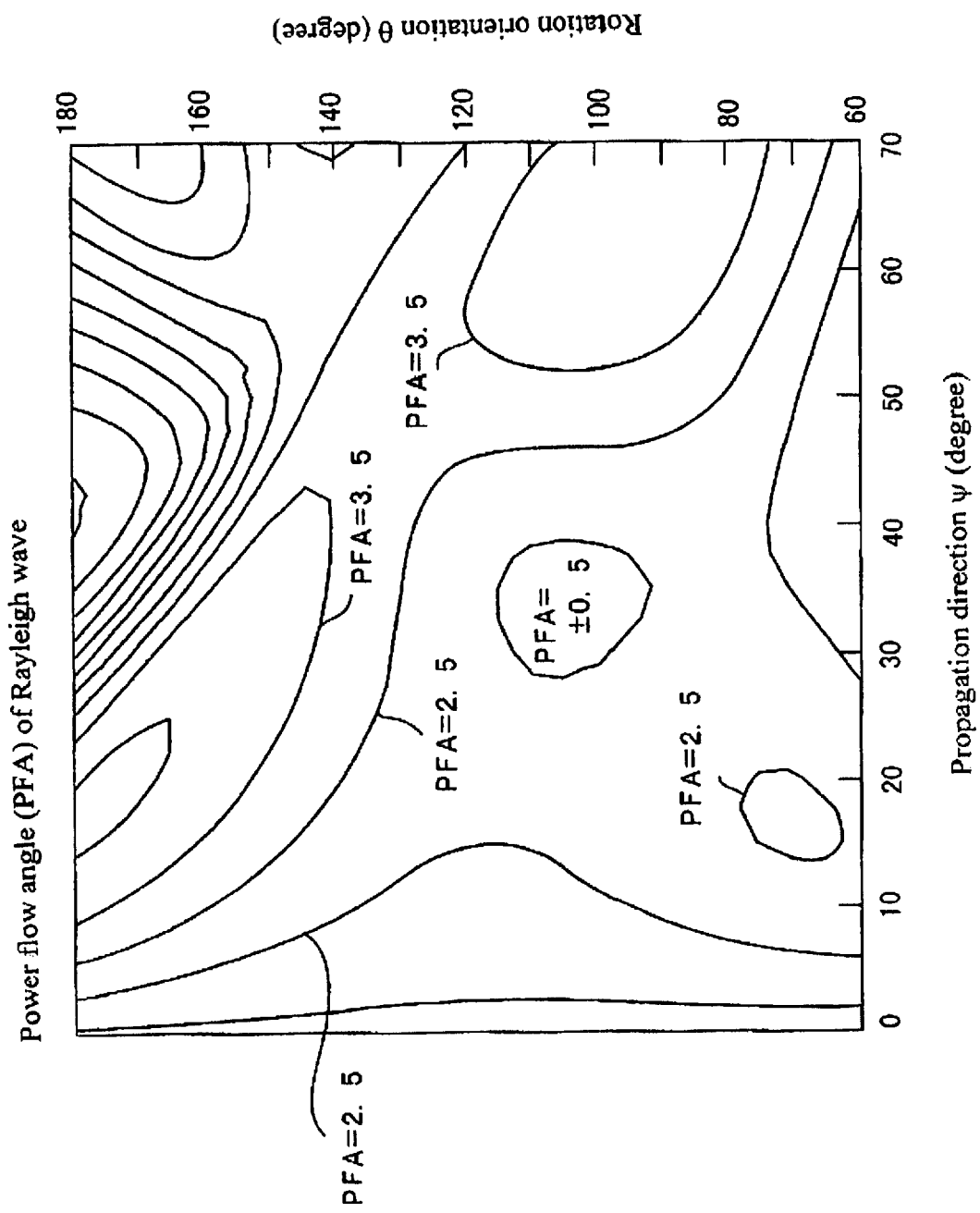
FIG. 14 is a diagram showing the substrate-orientation dependence of the power flow angle of the Rayleigh wave when the normalized film thickness of ZnO is about 0.30.

Its can be seen from FIGS. 6, 10, and 14, that the hatched region which is surrounded by the bold lines Y1 and Y2 in FIG. 6 meets the condition that the power flow angle PFA is as small as approximately −2.5 to +2.50°.

Figure 7:
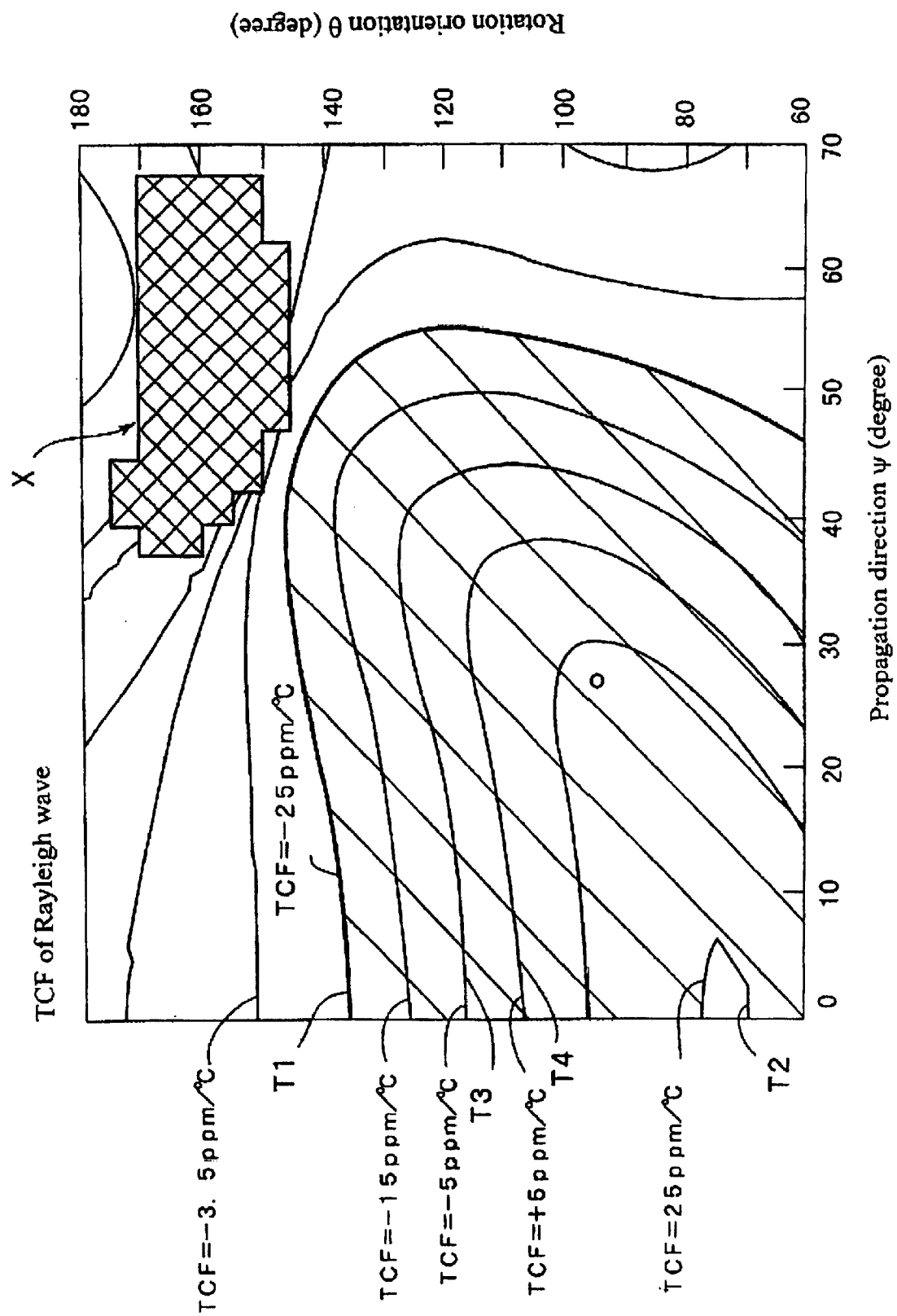
FIG. 7 is a diagram showing the substrate-orientation dependence of the temperature coefficient of frequency, TCF for the Rayleigh wave when the normalized film thickness of ZnO is about 0.20.
Figure 11:
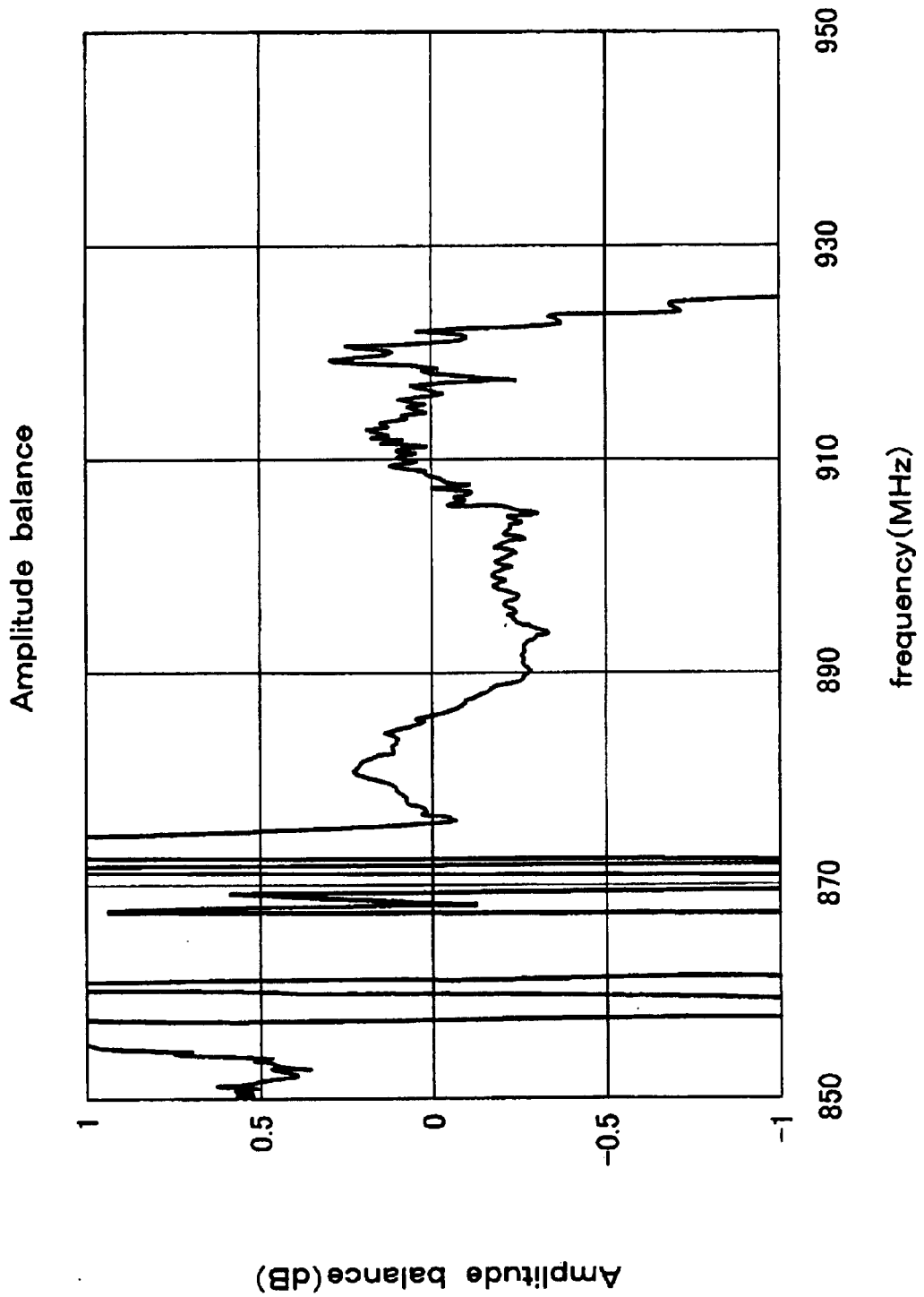
FIG. 11 is a diagram showing the substrate-orientation dependence of the temperature coefficient of frequency, TCF for the Rayleigh wave when the normalized film thickness of ZnO is about 0.25.
Figure 12:
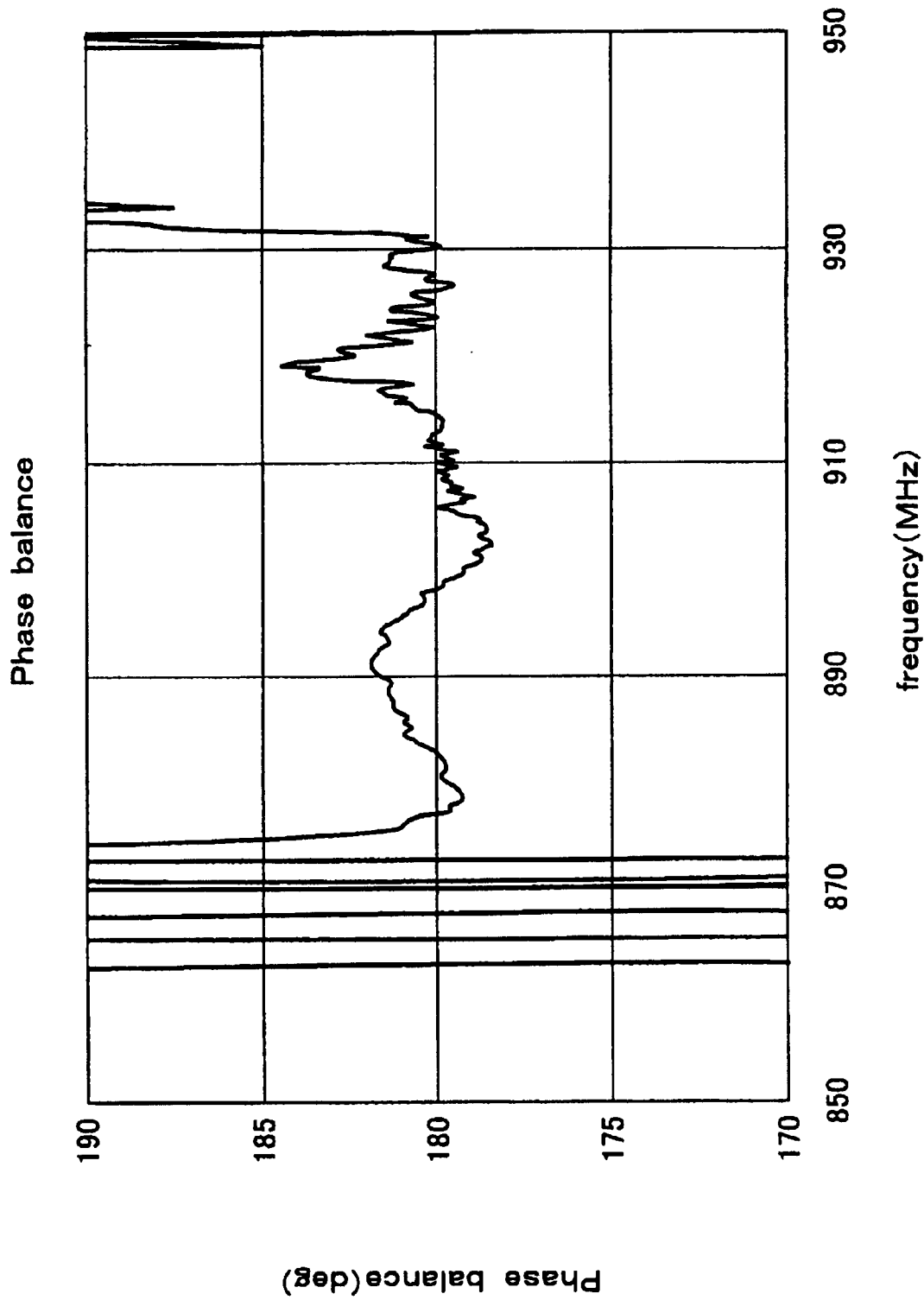
FIG. 12 is a diagram showing the substrate-orientation dependence of the electromechanical coupling coefficient for the Rayleigh wave, $K^2$, when the normalized film thickness of ZnO is about 0.25.
Figure 15:
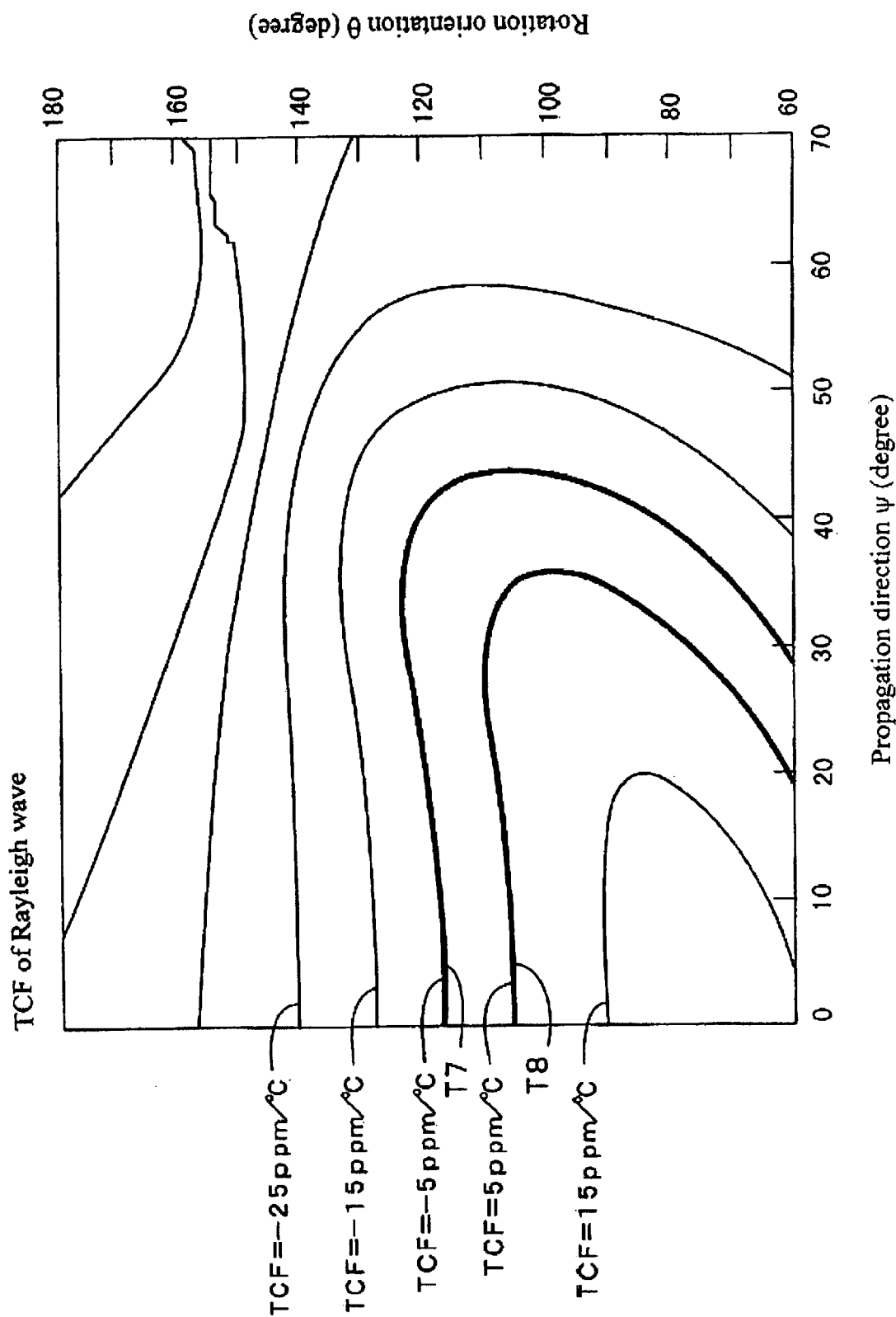
FIG. 15 is a diagram showing the substrate-orientation dependence of the temperature coefficient of frequency, TCF for the Rayleigh wave when the normalized film thickness of ZnO is about 0.30.
Figure 16:
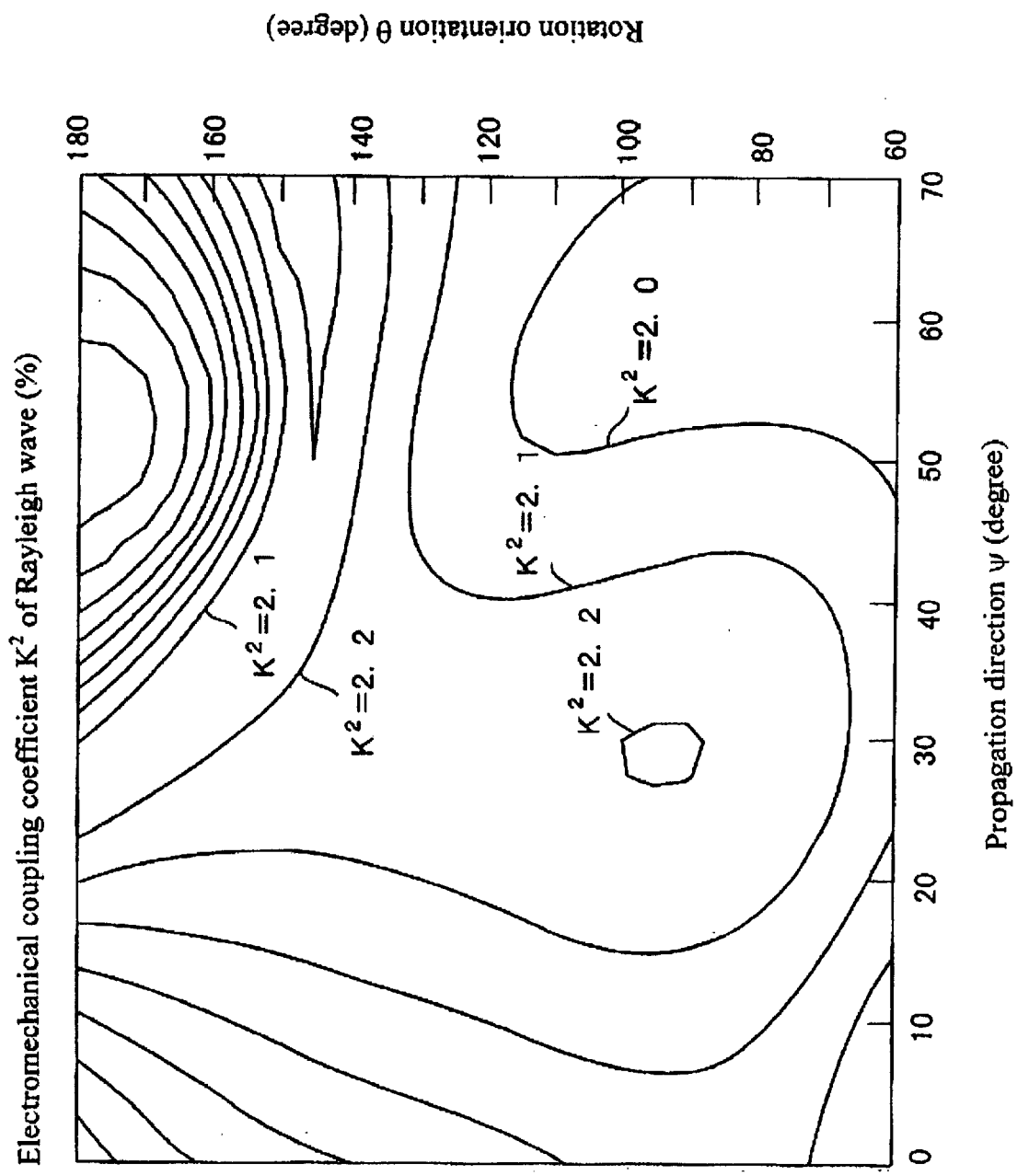
FIG. 16 is a diagram showing the substrate-orientation dependence of the electromechanical coupling coefficient for the Rayleigh wave, $K^2$, when the normalized film thickness of ZnO is about 0.30.

Also, it can be seen from FIGS. 7, 11, and 15, that the hatched region which is surrounded by the lines T1 and T2 in FIG. 7 meets the condition that the temperature coefficient of frequency, TCF is as small as approximately −25 to +25 ppm/° C. In particular, it can be recognized that the hatched regions which are surrounded by the lines T3 and T4 in FIG. 7, the lines T5 and T6 in FIG. 11, and the lines T7 and T8 in FIG. 15, meet the condition that the TCF is as small as approximately −5 to +5 ppm/° C., which is smaller than that in the case of the $Li_2B_4O_7$ substrate.

As described above, the electromechanical coupling coefficient $K^2$ can be made larger than that in the case where no ZnO thin film is formed, by setting the ZnO film thickness to be at least about 0.05 λ. However, a further improvement can be achieved by adjusting the Euler angles. For example, in FIG. 8, by adjusting the Euler angles, the coupling coefficients within the range surrounded by the bold line K become about 0.8% or above, that is, exhibit values larger than or equal to those of the conventional SAW device shown in FIG. 22A. When increasing the ZnO film thickness, the coupling coefficient increases at every Euler angle group, and at a particular film thickness, the range surrounded by the bold line K constitutes the range providing large coupling coefficients.

Figure 9:
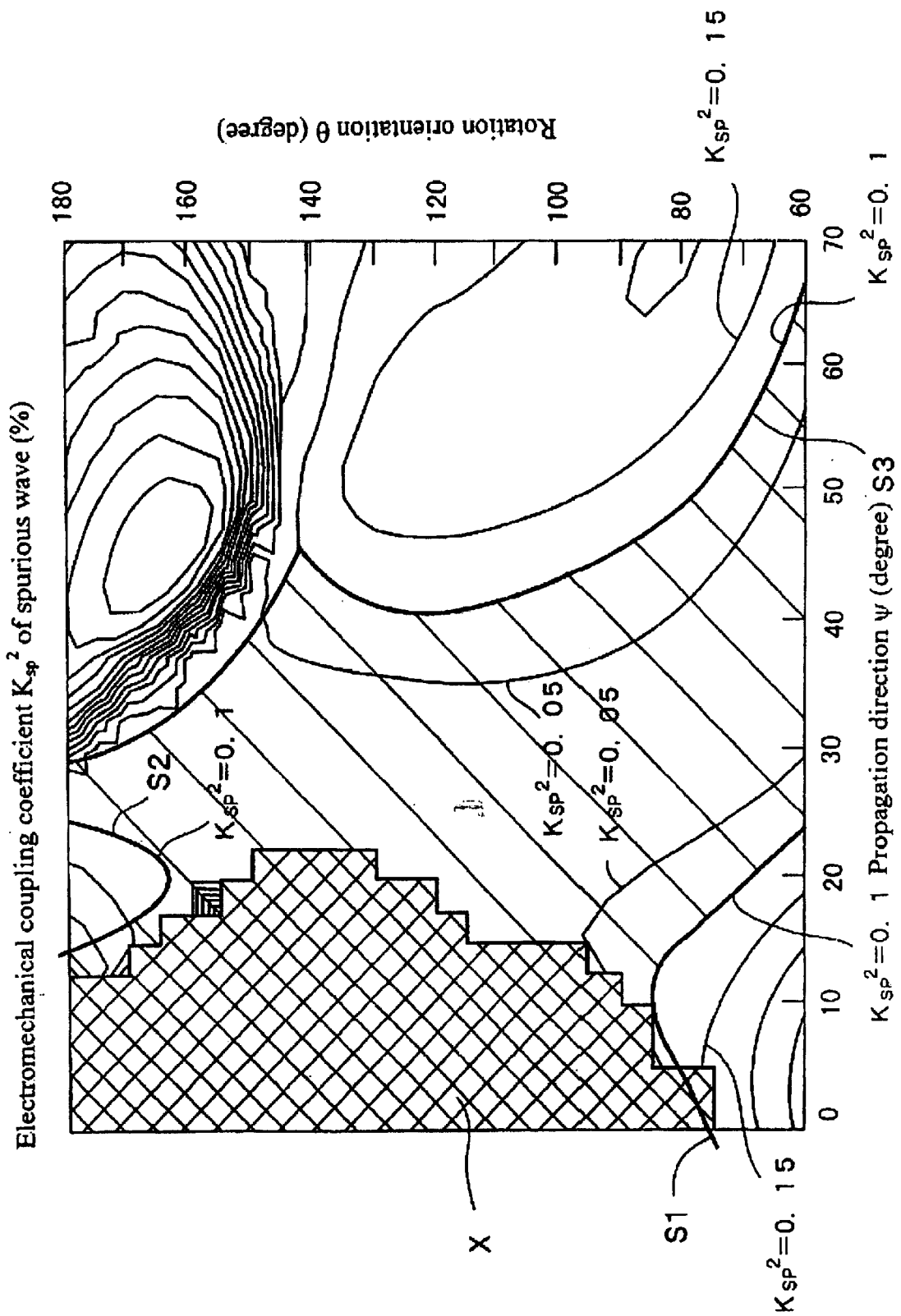
FIG. 9 is a diagram showing the substrate-orientation dependence of the electromechanical coupling coefficient for the spurious wave, $K_{sp}^2$ when the normalized film thickness of ZnO is about 0.20.
Figure 13:
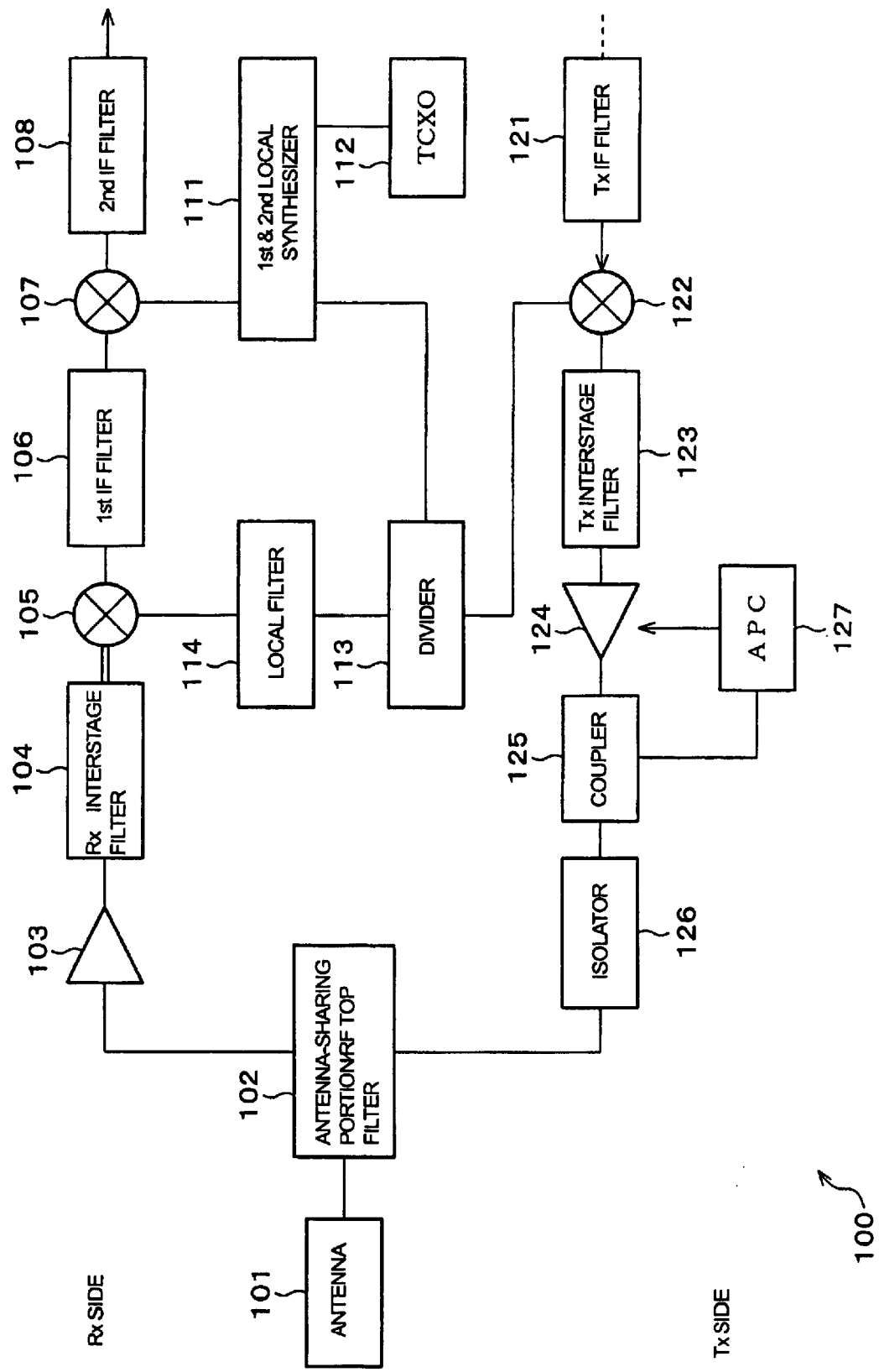
FIG. 13 is a diagram showing the substrate-orientation dependence of the electromechanical coupling coefficient for the spurious wave, $K_{sp}^2$, when the normalized film thickness of ZnO is about 0.25.
Figure 17:
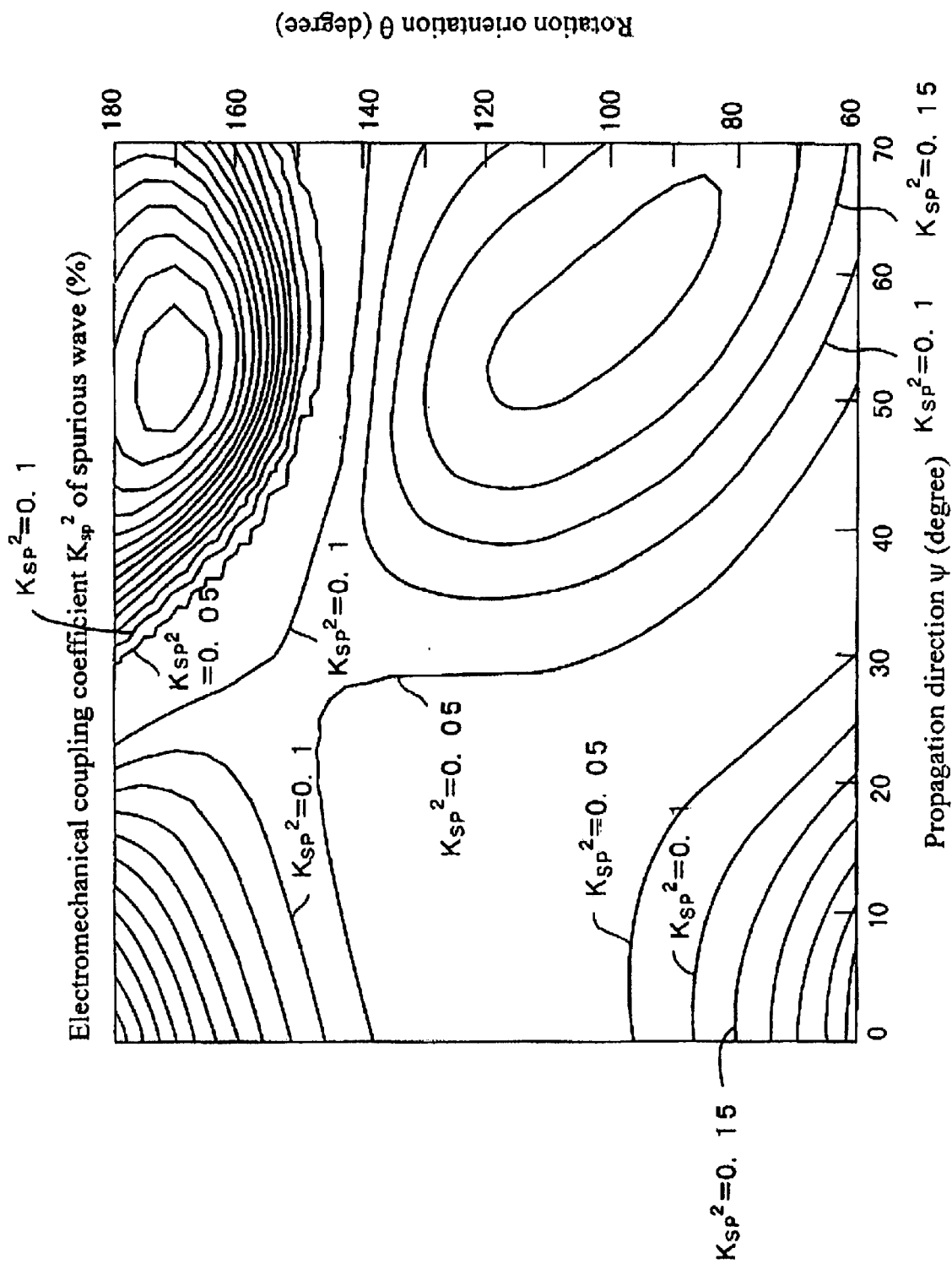
FIG. 17 is a diagram showing the substrate-orientation dependence of the electromechanical coupling coefficient for the spurious wave, $K_{sp}^2$, when the normalized film thickness of ZnO is about 0.30.

Its can be seen from FIGS. 9, 13, and 17, that the region which is surrounded by the bold lines S1, S2, and S3 meets the condition that the electromechanical coupling coefficient for the spurious wave, $K_{sp}^2$ is as small as approximately 0 to 0.1.

It can be understood, therefore, that, in the surface acoustic wave device having the structure in FIG. 1B wherein a piezoelectric thin film is disposed on the quartz substrate, and wherein comb electrodes are disposed between the quartz substrate and the piezoelectric thin film, a surface acoustic wave device which is small in the PFA, TCF, and $K_{sp}^2$ and large in the electromechanical coupling coefficient for the Rayleigh wave, $K^2$, can be provided by setting the Euler angles of the quartz substrate to above-described ranges.

Next, specific experimental examples will be described.

Here, the "power flow angle" refers to an angle which indicates a difference between the direction of the phase velocity of a surface acoustic wave and the direction of the group velocity thereof. When a power flow angle exists, the energy of a surface acoustic wave propagates while deviating by the power flow angle with respect to the normal direction of the electrode-fingers of the comb electrodes. The loss of the energy of the surface acoustic wave, $L_{PFA}$ at this time is expressed by the following equation (4).

$$L_{PFA} = 10 \times \log_{10}[\{W - \tan(PFA)\}/W](dB/\lambda) \quad (4)$$

where, W designates the cross width of the comb electrode, the cross width being normalized by the wavelength λ of the surface acoustic wave.

Figure 21:
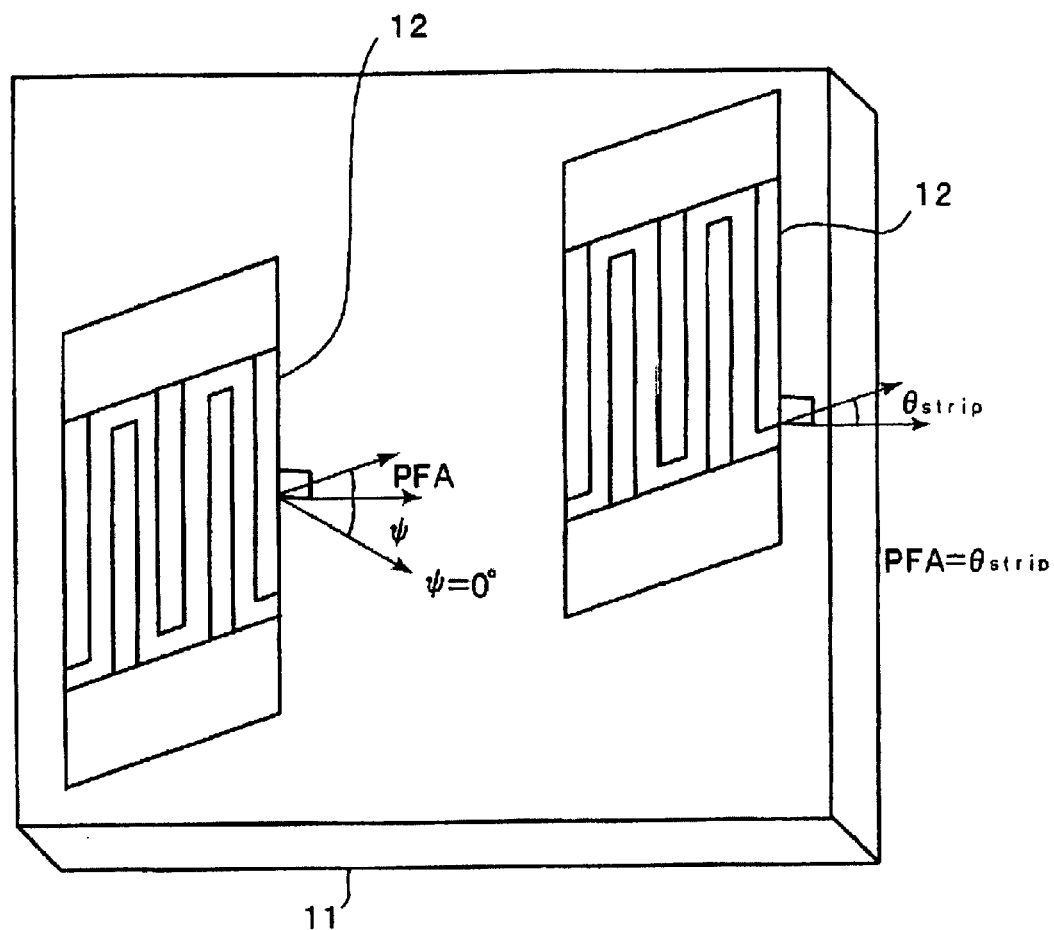
FIG. 21 is a schematic view for explaining the relationship between the electrode-finger disposition angle $\theta_{strip}$ of a comb electrode in the surface acoustic wave device and the power flow angle PFA.

Hence, it is desirable that the power flow angle PFA of the surface acoustic wave substrate be 0°, as described above. When a PFA exists, however, the degree of difficulty in designing comb electrode is higher. However, as shown in FIG. 21, by making the electrode-finger disposition angle $\theta_{strip}$ of a comb electrode 12 on the surface acoustic wave substrate 11 agree with the PFA, the deterioration of the insertion loss due to the difference between the $\theta_{strip}$ and the PFA can be inhibited. Conversely, if the electrode-finger disposition angle and the PFA differ from each other, the insertion loss will deteriorate.

In the surface acoustic wave substrate in accordance with preferred embodiments of the present invention, there exists the spurious wave having a sound speed of about 110% of that of the Rayleigh wave. In the above-described comb electrode wherein the electrode-finger disposition angle $\theta_{strip}$ has been made to agree with the power flow angle PFA of the Rayleigh wave, the loss of the spurious wave, $L_{PFASP}$ due to ΔPFA is expressed by the following equation (5), where the difference in the power flow angle between the Rayleigh wave and the spurious wave is ΔPFA.

$$L_{PFASP} = 10 \times \log_{10}[\{W - \tan(\Delta PFA)\}/W](dB/\lambda) \quad (5)$$

It is recognized from the equation (5) that the response of spurious wave can be suppressed by increasing the ΔPFA. For example, when the surface acoustic wave propagated by 20λ in a comb electrode with W=10λ, the spurious wave can be suppressed by about 1.5 dB when ΔPFA=1°.

Figure 18:
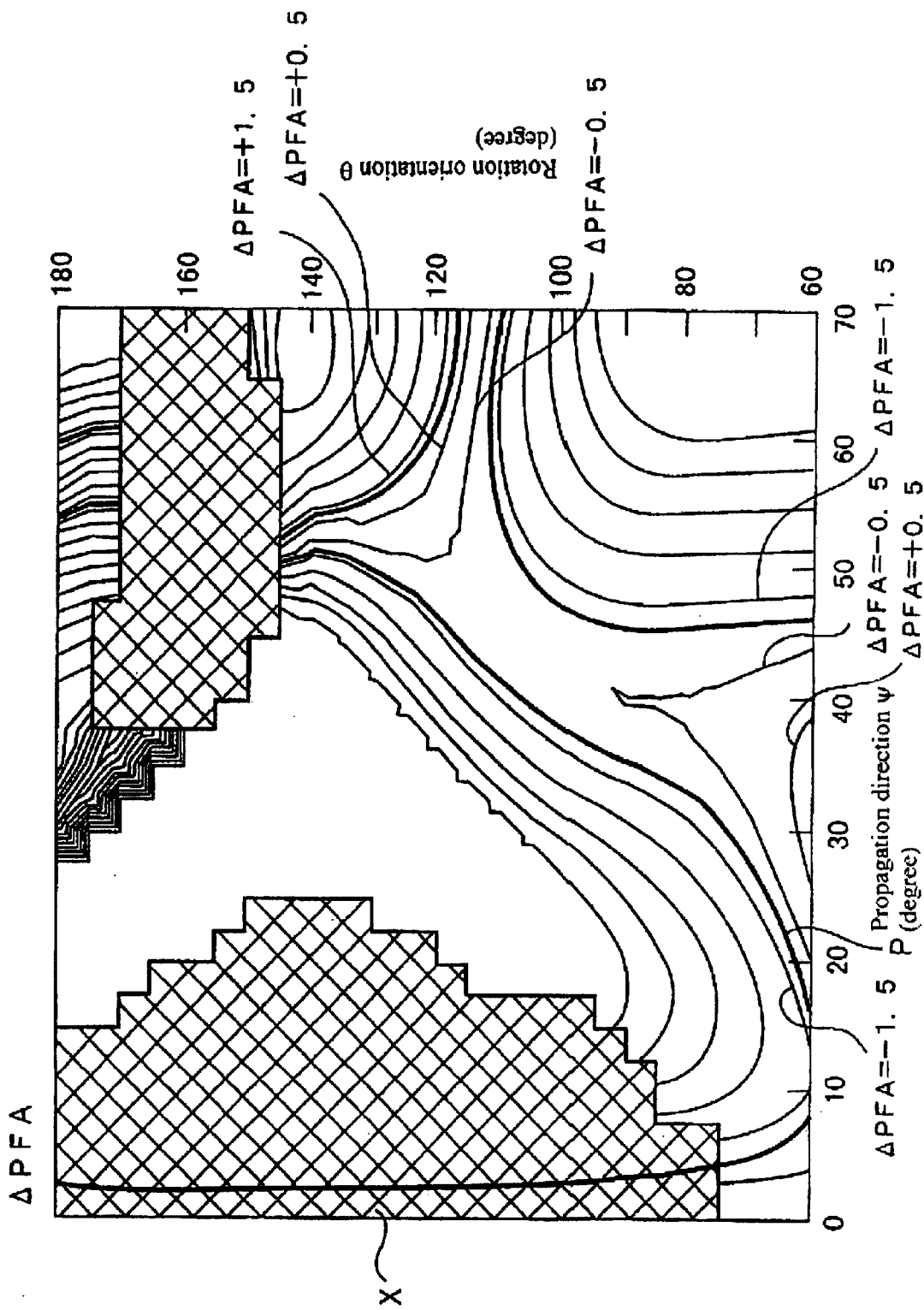
FIG. 18 is a diagram showing the substrate-orientation dependence of ΔAPFA when the normalized film thickness of ZnO is about 0.2.
Figure 19:
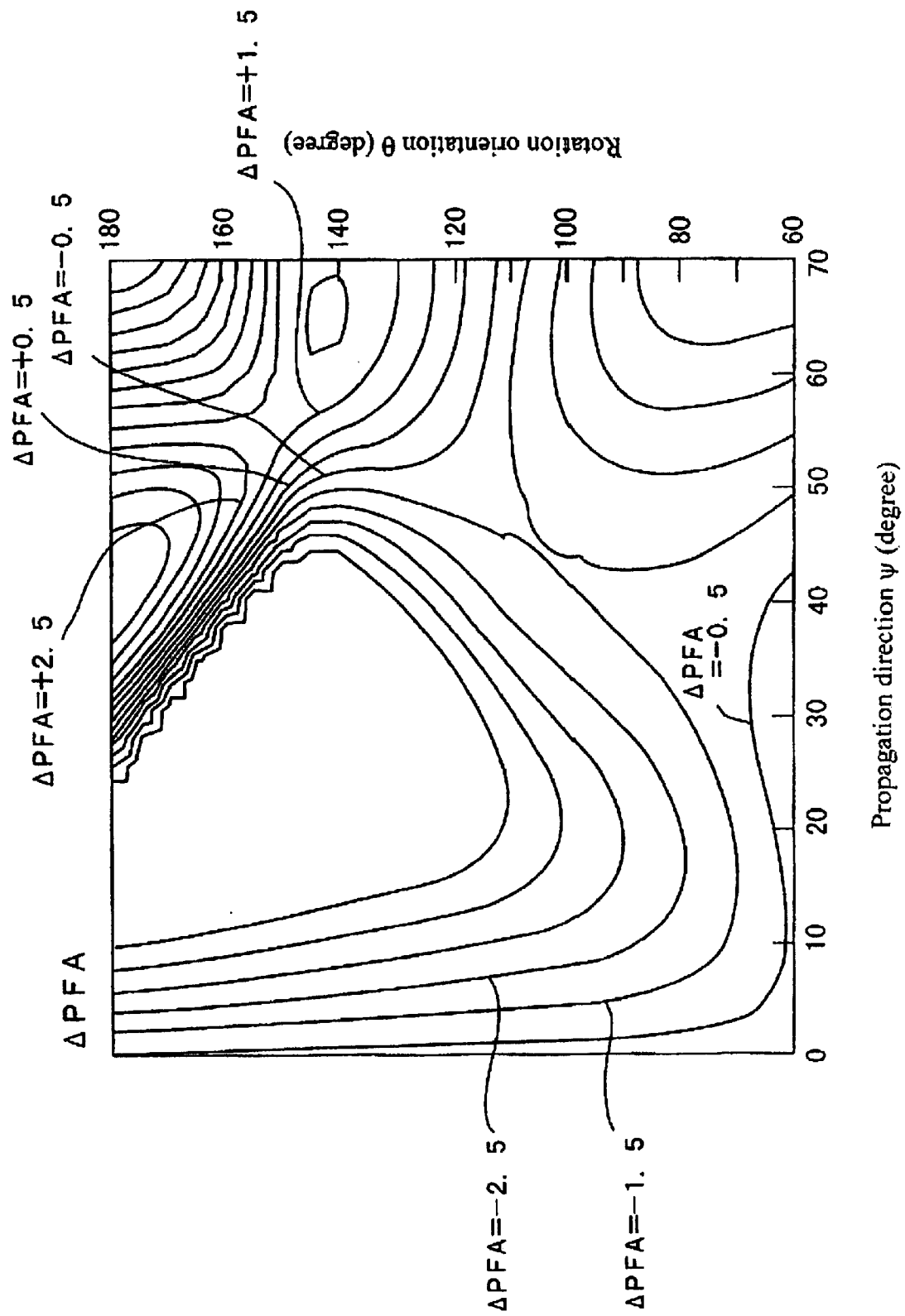
FIG. 19 is a diagram showing the substrate-orientation dependence of ΔPFA when the normalized film thickness of ZnO is about 0.25.
Figure 20:
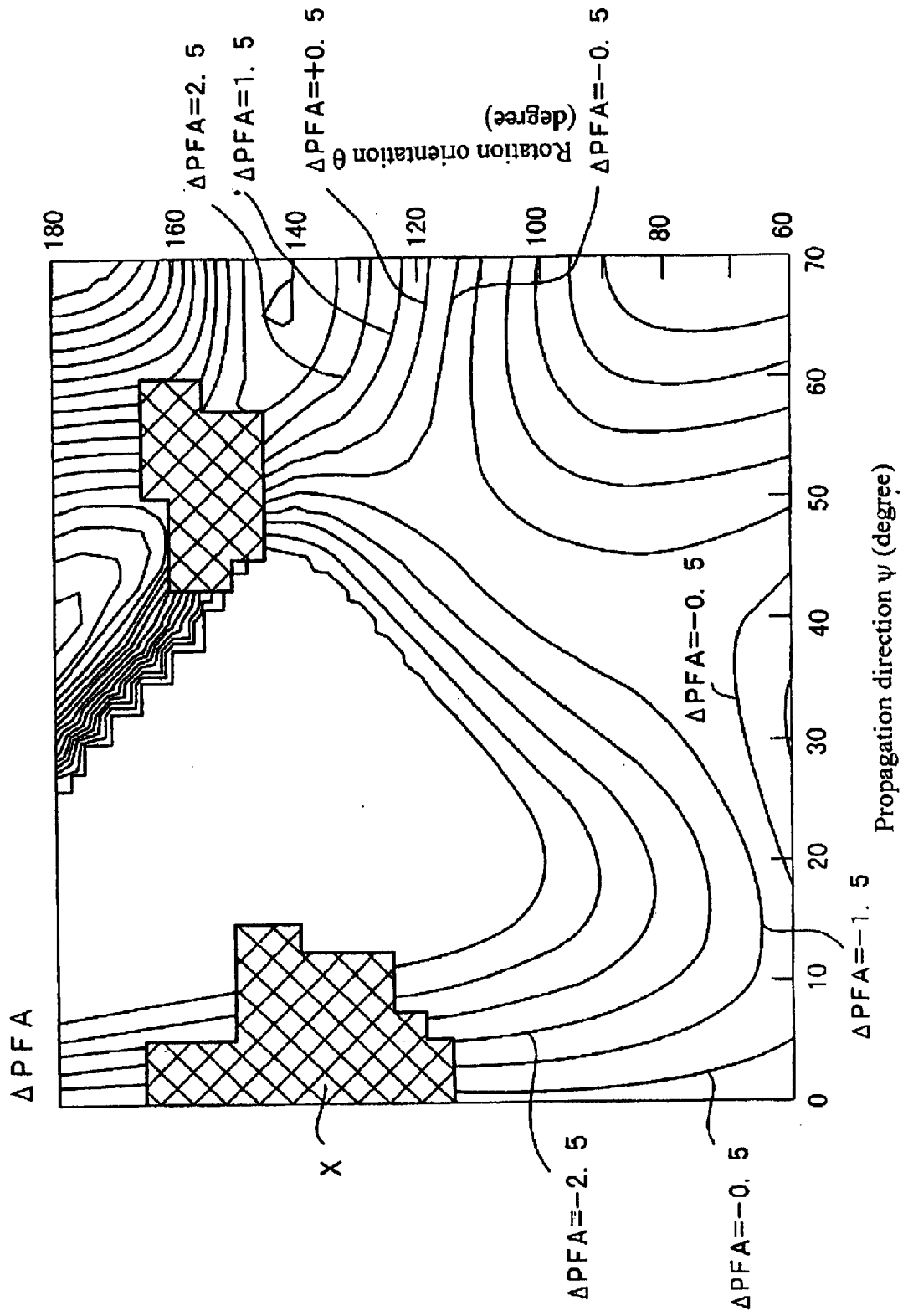
FIG. 20 is a diagram showing the substrate-orientation dependence of ΔPFA when the normalized film thickness of ZnO is about 0.30.

FIGS. 18 through 20 are diagrams showing the substrate dependence of the ΔPFA. FIGS. 18 through 20 shows the substrate dependence of the ΔPFA when the thicknesses of the ZnO film are approximately 0.20 λ, 0.25 λ, and 0.30 λ, in the SAW device having the structure of a ZnO/Al/quartz substrate as in the case of FIGS. 6 through 17. The contour lines in FIGS. 18 through 20 mean that all points on each of these lines have equal ΔPFA values. It can be recognized from FIGS. 18 through 20, that the line P in FIG. 18 satisfies the condition that ΔPFA is within ±1°.

Figure 27:
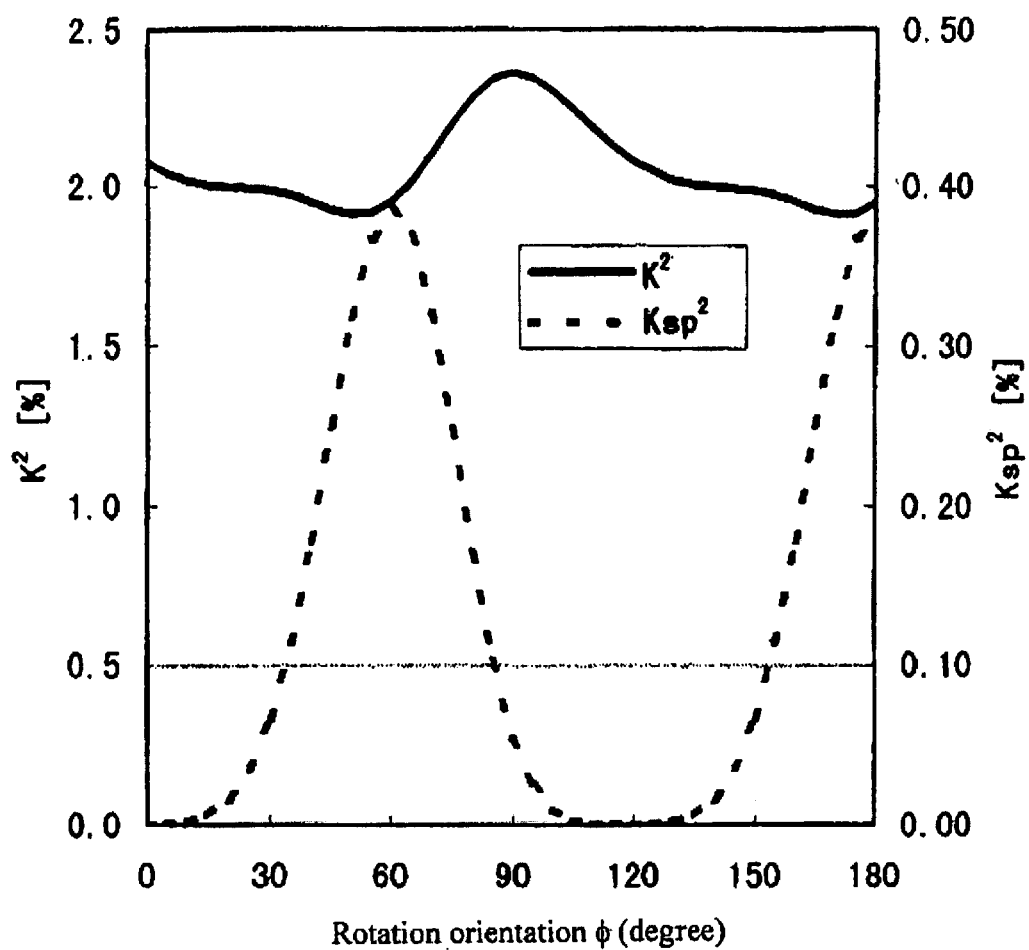
FIG. 27 is a graph illustrating a relationship between a rotational direction Φ and an electromechanical coupling coeffcient $K^2$ of the Rayleigh wave and a relationship between a rotational direction Φ and an electromechanical coupling coefficient $K_{sp}^2$ of the spurious wave in the case where the normalized thickness of ZnO is 0.3λ and the Euler angle (Φ, 117°, 0°).

FIG. 27 is a graph illustrating a relationship between a rotational direction Φ and an electromechanical coupling coeffcient $K^2$ of the Rayleigh wave and a relationship between a rotational direction Φ and an electromechanical coupling coefficient $K_{sp}^2$ of the spurious wave in the case where the normalized thickness of ZnO is 0.3 λ and the Euler angle (Φ, 117°, 0°). As is understood from FIG. 27, the electromechanical coupling coefficient $K_{sp}^2$ of the spurious wave becomes 0.1% or less when the rotational direction Φ is within a range of −35° to +35° or a range of 85° to +155°.

As described in the above-mentioned Literature 1, the fundamental principle of preferred embodiments of the present invention is to offset the temperature characteristics of the quartz substrate by that of the piezoelectric thin film and to thereby achieve a superior frequency temperature characteristics, by forming a piezoelectric thin film having a negative TCF value on a quartz substrate having a cut angle and a propagation direction which provide a positive value of the temperature coefficient of frequency, TCF. Hence, it is preferable that, as the piezoelectric thin film, one which has a negative TCF value be used.

In the above-described preferred embodiments, explanations were made of the cases in each of which a ZnO thin film is formed as the piezoelectric thin film, but piezoelectric thin films which have positive TCF values, such as piezoelectric thin films each constituted of AlN, $Ta_2O_5$, CdS, or other suitable material may be used, in addition to a ZnO thin film.

With regard to the quartz substrate, the surface on which the piezoelectric thin film is laminated may be either the positive surface or the negative surface thereof.

The surface acoustic wave obtained when a piezoelectric thin film is formed on the quartz substrate can have somewhat displacement component in the SH direction. Herein, however, it is to be noted that such a Rayleigh wave which is deformed into the surface acoustic wave is counted among the Rayleigh wave, for convenience.

The calculated values shown in this application are the ones obtained on the condition that the compactness of the ZnO thin film is sufficiently high. It is to be noted that if the compactness of the ZnO thin film is low, the calculated values will be close to the ones when the film thickness of the ZnO film is small.

As is evident from the foregoing, since, in the surface acoustic wave device in accordance with preferred embodiments of the present invention, the piezoelectric thin film is formed on the quartz substrate, the comb electrodes are formed between the quartz substrate and the piezoelectric thin film, and the normalized film thickness $H/\lambda$ of the piezoelectric thin film is at least about 0.05, it is possible to provide a surface acoustic wave device which has a large electromechanical coupling coefficient for the Rayleigh wave, $K^2$.

Particularly, when the normalized film thickness $H/\lambda$ of the piezoelectric thin film is not smaller than about 0.20, the electromechanical coupling coefficient for the Rayleigh wave, $K^2$ can be more larger.

When the piezoelectric thin film is in contact with the quartz substrate and/or the comb electrodes at the negative surface thereof, that is, when the positive surface of the piezoelectric thin film is arranged so as to be the top surface, the electromechanical coupling coefficient $K^2$ can be further more larger.

Also, a short-circuit electrode may be further formed on the piezoelectric thin film. In this case also, a surface acoustic wave device which has a large electromechanical coupling coefficient $K^2$ can be formed in accordance with preferred embodiments of the present invention.

When the Euler angles of the quartz substrate is in the range surrounded by the lines Y1 and Y2 in FIG. 6, the power flow angle can be within approximately +2.50°.

When the Euler angles of the quartz substrate is in the range surrounded by the lines T1 and T2 in FIG. 7, the temperature coefficient of frequency, TCF of the surface acoustic wave device can be within ±25 ppm/° C., thereby providing a surface acoustic wave device which has a low temperature dependence. Particularly when the Euler angles of the quartz substrate is in the range surrounded by the lines T3 and T4 in FIG. 7, the temperature coefficient of frequency, TCF of the surface acoustic wave device can be within approximately ±5 ppm/° C.

Figure 8:
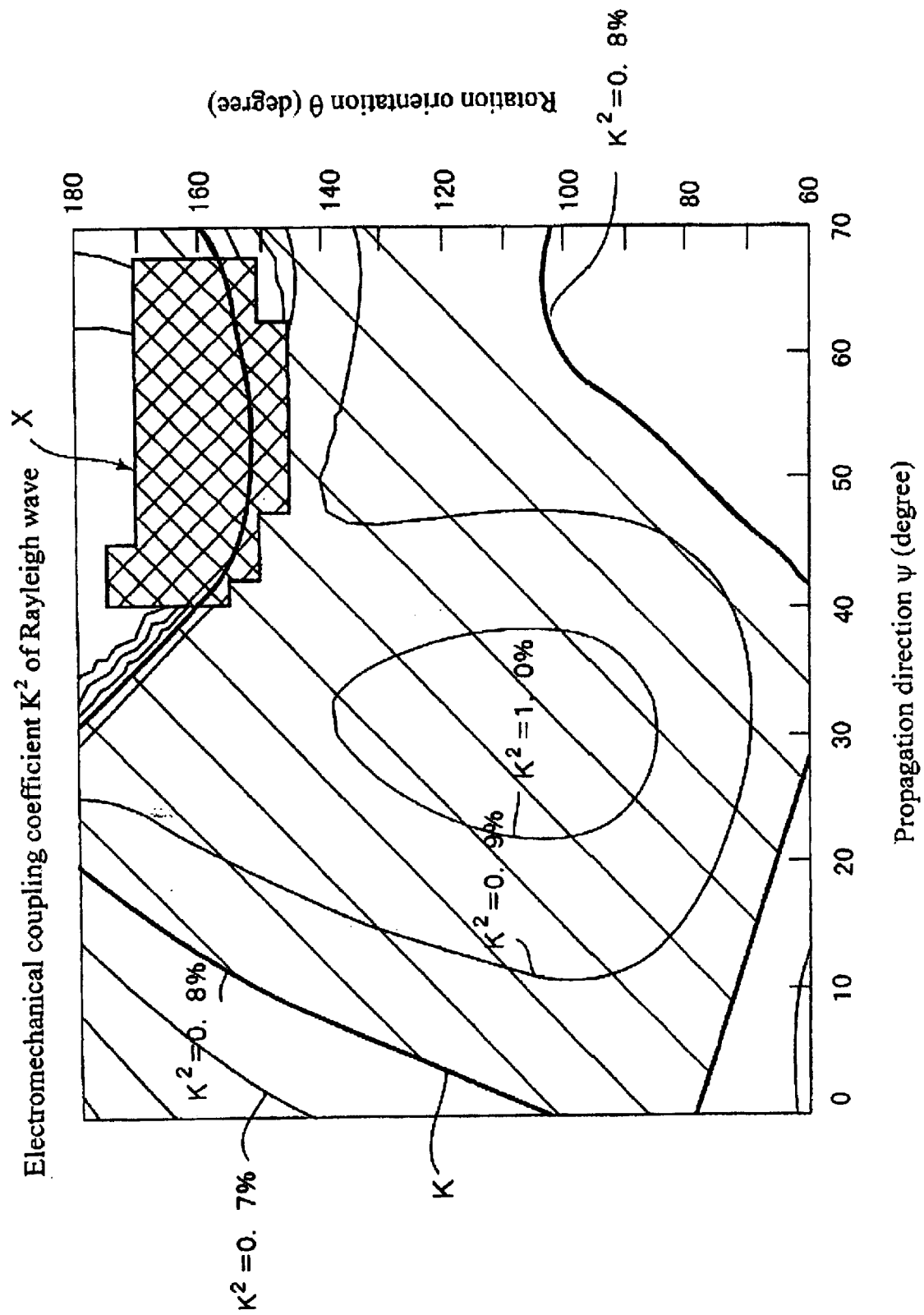
FIG. 8 is a diagram showing the substrate-orientation dependence of the electromechanical coupling coefficient for the Rayleigh wave, $K^2$, when the normalized film thickness of ZnO is about 0.20.

Moreover, when the Euler angles of the quartz substrate is in the range surrounded by the line K in FIG. 8, the electromechanical coupling coefficient for the Rayleigh wave, $K^2$ can be about 0.8% or above.

When the Euler angles of the quartz substrate is in the range surrounded by the lines S1, S2, and S3 in FIG. 9, the electromechanical coupling coefficient for the spurious wave, $K_{sp}^2$ can be about 0.1% or below, thereby suppressing the influence of the spurious wave.

When the temperature coefficient of frequency, TCF of the piezoelectric thin film has a negative value, this is offset by that of the quartz substrate, which allows a surface acoustic wave device which has a low temperature dependence to be easily formed.

When the Euler angles of the quartz substrate is in the range surrounded by the line P in FIG. 18, since the difference in the power flow angle, $\Delta$PFA between the surface acoustic wave to be utilized and a unwanted surface acoustic wave not to be utilized, is within ±1°, a surface acoustic wave device which has superior characteristics can be provided. Particularly when the distance $L_{11}$ between adjacent IDTs satisfies the relationship $L_{11}>W/\tan(\Delta PFA)$ where the cross width of an electrode-finger of the IDT is W, the influence of unwanted surface acoustic wave can be more effectively inhibited.

While the present invention has been described with reference to what are at present considered to be the preferred embodiments, it is to be understood that various changes and modifications may be made thereto without departing from the invention in its broader aspects and therefore, it is intended that the appended claims cover all such changes and modifications as fall within the true spirit and scope of the invention.

What is claimed is:

1. A surface acoustic wave device, comprising:
   a quartz substrate;
   a piezoelectric thin film disposed on said quartz substrate;
   comb electrodes disposed between said quartz substrate and said piezoelectric thin film; and
   the normalized film thickness $H/\lambda$ of said piezoelectric thin film is at least about 0.20, wherein the film thickness of said piezoelectric thin film is H, and the wavelength of a surface acoustic wave is $\lambda$; wherein
   the Euler angles of said quartz substrate are within the range such that the temperature coefficient of frequency TCF of the surface acoustic wave device is within about ±25 ppm/° C.

2. A surface acoustic wave device in accordance with claim 1, wherein said piezoelectric thin film contacts at least one of said substrate and said comb electrodes at the negative surface thereof.

3. A surface acoustic wave device in accordance with claim 1, further comprising a short-circuit electrode disposed on said piezoelectric thin film.

4. A surface acoustic wave device in accordance with claim 1, wherein the Euler angles of said quartz substrate are within the range such that the power flow angle PFA of a Rayleigh wave is within about ±2.5°.

5. A surface acoustic wave device in accordance with claim 1, wherein the Euler angles of said quartz substrate are within the range such that the temperature coefficient of frequency TCF of the surface acoustic wave device is within about ±5 ppm/° C.

6. A surface acoustic wave device in accordance with claim 1, wherein the Euler angles of said quartz substrate are within the range such that the electromechanical coupling coefficient for the Rayleigh wave, $K^2$ is not smaller than about 0.8%.

7. A surface acoustic wave device comprising:
a quartz substrate;
a piezoelectric thin film disposed on said quartz substrate;
comb electrodes disposed between said quartz substrate and said piezoelectric thin film; and
the normalized film thickness H/λ of said piezoelectric thin film is at least about 0.20, wherein the film thickness of said piezoelectric thin film is H, and the wavelength of a surface acoustic wave is λ; wherein
the Euler angles of said quartz substrate are within the range such that the power flow angle PFA of a Rayleigh wave is within about ±2.50; and
the Euler angles of said quartz substrate are within the range such that the electromechanical coupling coefficient for a spurious wave $K_{sp}^2$ is not larger than about 0.05%.

8. A surface acoustic wave device in accordance with claim 1, wherein the temperature coefficient of frequency, TCF of said piezoelectric thin film has a negative value.

9. A surface acoustic wave device in accordance with claim 1, wherein the Euler angles of said quartz substrate are within the range such that the difference in the power flow angle, ΔPFA between the surface acoustic wave to be utilized and the unwanted surface acoustic wave not to be utilized is within about ±1°.

10. A surface acoustic wave device in accordance with claim 1, wherein said piezoelectric thin film is made of a material selected from the group consisting of ZnO, AlN, $Ta_2O_5$, and CdS.

11. A surface acoustic wave device according to claim 1, wherein the angle Φ of the Euler angles (Φ,θ,ψ) is within a range of −35° to +35°.

12. A surface acoustic wave device, comprising:
a quartz substrate;
a piezoelectric thin film disposed on said quartz substrate;
comb electrodes disposed between said quartz substrate and said piezoelectric thin film; and
the normalized film thickness H/λ of said piezoelectric thin film is at least about 0.20, wherein the film thickness of said piezoelectric thin film is H, and the wavelength of a surface acoustic wave is λ; wherein
the Euler angles of said quartz substrate are within a range such that the power flow angle PFA of a Rayleigh wave is within about ±2.5°;
said range of the Euler angles set such that the PFA is within about ±2.5° is within an area surrounded by lines which are represented by the following equations:

$\theta = 201.77292 - 8.1909*\psi + 0.3257*\psi^2 - 0.00532*\psi^3 + 0.0000286691*\psi^4$ and $3 \leq \psi \leq 40$;

$\theta = -2.3333*\psi + 221.33$ and $40 \leq \psi \leq 43$;

$\theta = -20.667*\psi + 1009.7$ and $43 \leq \psi \leq 44.5$;

$\psi = 242.92932 - 2.46296*\theta - 0.04285*\theta^2 + 0.000792121*\theta^3 - 0.00000316309*\theta^4$ and $60 \leq \psi \leq 106$;

$\theta = 60$ and $28 \leq \psi \leq 70$;

$\theta = 1.39744*\psi^2 - 78.37179*\psi + 1158.8$ and $27.5 \leq \psi \leq 32$;

$\theta = 9.8429 + 15.55204*\psi - 1.0153*\psi^2 + 0.0306*\psi^3 - 0.000038175*\psi^4$ and $3 \leq \psi \leq 32$;

$\theta = 60$ and $0 \leq \psi \leq 4$;

$\psi = 0$ and $60 \leq \psi \leq 180$;

$\theta = 180$ and $0 \leq \psi \leq 4$; and the Euler angles of said quartz substrate are within a range such that the electromechanical coupling coefficient for a spurious wave, $K_{sp}^2$ is not larger than about 0.05%;
said range of the Euler angles set such that $K_{sp}^2$ is not larger than about 0.05% is within an area surrounded by lines which are represented by the following equations:

$\theta = 461.5 - 51.23992*\psi + 3.55894*\psi^2 - 0.12153*\psi^3 + 0.00171*\psi^4$ and $12 \leq \psi \leq 25.5$:

$\theta = -10*\psi + 425$ and $24 \leq \psi \leq 25.5$;

$\theta = -88.97104 + 38.79904*\psi - 1.80561*\psi^2 + 0.03334*\psi^3 - 0.0000217323*\psi^4$ and $27 \leq \psi \leq 43$;

$\theta = -0.013928594*\psi^4 + 2.255507173*\psi^3 - 136.803833233*\psi^2 + 3684.063042727*\psi - 3702400$ and $33 \leq \psi \leq 43$;

$\theta = 0.0009461088154*\psi^4 - 0.178399621211*\psi^3 + 12.5950972795403*\psi^2 - 395.999782194768*\psi + 4763.57$ and $33 \leq \psi \leq 55$;

$\theta = 60$ and $29 \leq \psi \leq 55$;

$\theta = 0.01724063*\psi^3 - 1.20723413*\psi^2 + 24.63357158*\psi - 58$ and $16 \leq \psi \leq 30$;

$\theta = 0.0139*\psi^2 + 0.9028*\psi + 79$ and $79 \leq \psi \leq 100$;

$\theta = 0$ and $78 \leq \theta \leq 180$;

$\theta = 180$ and $0 \leq \psi \leq 3$;

$\theta = 180$ and $24 \leq \psi \leq 29$.

* * * * *